US012010449B2

(12) United States Patent
Brady et al.

(10) Patent No.: US 12,010,449 B2
(45) Date of Patent: Jun. 11, 2024

(54) IMAGING DEVICES WITH GATED TIME-OF-FLIGHT PIXELS WITH FAST CHARGE TRANSFER

(71) Applicant: SONY SEMICONDUCTOR SOLUTIONS CORPORATION, Kanagawa (JP)

(72) Inventors: Frederick Brady, Webster, NY (US); Adarsh Basavalingappa, Fairport, NY (US); Taisuke Suwa, Auderghem (BE); Michiel Timmermans, Werchter (BE); Sungin Hwang, Pittsford, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 130 days.

(21) Appl. No.: 17/610,257

(22) PCT Filed: May 21, 2020

(86) PCT No.: PCT/IB2020/000398
§ 371 (c)(1),
(2) Date: Nov. 10, 2021

(87) PCT Pub. No.: WO2020/234648
PCT Pub. Date: Nov. 26, 2020

(65) Prior Publication Data
US 2022/0247952 A1 Aug. 4, 2022

Related U.S. Application Data

(60) Provisional application No. 62/850,911, filed on May 21, 2019.

(51) Int. Cl.
*H04N 25/76* (2023.01)
*G01S 7/4863* (2020.01)
(Continued)

(52) U.S. Cl.
CPC ........... *H04N 25/76* (2023.01); *G01S 7/4863* (2013.01); *G01S 17/894* (2020.01); *H01L 27/14607* (2013.01)

(58) Field of Classification Search
CPC ............ H01L 27/14607; G01S 7/4863; G01S 17/894; H04N 25/76
(Continued)

(56) References Cited

U.S. PATENT DOCUMENTS

| 2012/0175685 A1* | 7/2012 | Kim .................. H01L 27/14641 257/225 |
| 2014/0252437 A1* | 9/2014 | Oh .................... H01L 27/14603 257/292 |
| 2018/0219035 A1* | 8/2018 | Otsuki .................. H04N 25/70 |

OTHER PUBLICATIONS

International Search Report prepared by the European Patent Office dated Jul. 28, 2020, for International Application No. PCT/IB2020/000398, 3 pgs.
(Continued)

*Primary Examiner* — Frantz B Jean
(74) *Attorney, Agent, or Firm* — Sheridan Ross PC

(57) ABSTRACT

A pixel array includes a plurality of pixels. Each pixel includes a photoelectric conversion region that converts incident light into electric charge, and a charge transfer section coupled to the photoelectric conversion region and having line symmetry along a first axis in a plan view. The charge transfer section includes a first transfer transistor coupled to a first floating diffusion and the photoelectric conversion region and located at a first side of the photoelectric conversion region, and a second transfer transistor coupled to a second floating diffusion and the photoelectric conversion region and located at the first side of the photoelectric conversion region.

20 Claims, 20 Drawing Sheets

(51) Int. Cl.
*G01S 17/894* (2020.01)
*H01L 27/146* (2006.01)

(58) Field of Classification Search
USPC .......................................... 348/135
See application file for complete search history.

(56) References Cited

OTHER PUBLICATIONS

Written Opinion prepared by the European Patent Office dated Jul. 28, 2020, for International Application No. PCT/IB2020/000398, 7 pgs.

* cited by examiner

IMAGING DEVICES WITH GATED TIME-OF-FLIGHT PIXELS WITH FAST CHARGE TRANSFER

CROSS REFERENCE TO RELATED APPLICATIONS

This application is a national stage application under 35 U.S.C. 371 and claims the benefit of PCT Application No. PCT/IB2020/000398 having an international filing date of 21 May 2020, which designated the United States, which PCT application claimed the benefit of U.S. Provisional Application No. 62/850,911 filed 21 May 2019, the entire disclosures of each of which are incorporated herein by reference.

FIELD

Example embodiments are directed to imaging devices, imaging apparatuses, and methods for operating the same, and more particularly, to imaging devices, imaging apparatuses, and methods for depth sensing.

BACKGROUND

Depth sensing has applications in many fields, including object tracking, environment rendering, etc. Some depth sensors employ time-of-flight (ToF) principles to detect a distance to an object or objects within a scene. In general, a ToF depth sensor includes a light source and an imaging device including a plurality of pixels for sensing reflected light. In operation, the light source emits light (e.g., infrared light) toward an object or objects in the scene, and the pixels detect the light reflected from the object or objects. The elapsed time between the initial emission of the light and receipt of the reflected light by each pixel may correspond to a distance from the object or objects. Direct ToF imaging devices may measure the elapsed time itself to calculate the distance while indirect ToF imaging devices may measure the phase delay between the emitted light and the reflected light and translate the phase delay into a distance. The depth values of the pixels are then used by the imaging device to determine a distance to the object or objects, which may be used to create a three dimensional scene of the captured object or objects.

SUMMARY

Example embodiments relate to imaging devices, imaging apparatuses, and methods thereof that allow for fast charge transfer from photodiodes to pixel circuits, fast overflow reset, etc.

At least one example embodiment is directed to a pixel array including a plurality of pixels, each pixel including a photoelectric conversion region that converts incident light into electric charge, and a charge transfer section coupled to the photoelectric conversion region and having line symmetry along a first axis in a plan view. The charge transfer section includes a first transfer transistor coupled to a first floating diffusion and the photoelectric conversion region and located at a first side of the photoelectric conversion region, and a second transfer transistor coupled to a second floating diffusion and the photoelectric conversion region and located at the first side of the photoelectric conversion region.

According to at least one example embodiment, the charge transfer section includes a third transfer transistor coupled to an overflow region and located at the first side of the photoelectric conversion region and between the first transfer transistor and the second transfer transistor.

According to at least one example embodiment, the first axis passes through a gate of the third transfer transistor.

According to at least one example embodiment, the gate of the third transfer transistor is positioned further away from a center of the pixel than a gate of the first transfer transistor and a gate of the second transfer transistor.

According to at least one example embodiment, the gate of the first transfer transistor and the gate of the second transfer transistor are equidistant to the center of the pixel.

According to at least one example embodiment, the gate of the third transfer transistor is closer to a center of the pixel than the gate of the first transfer transistor and the gate of the second transfer transistor.

According to at least one example embodiment, each pixel further comprises a transistor section in which a plurality of transistors are disposed, and the transistor section has line symmetry along the first axis.

According to at least one example embodiment, the plurality of transistors include third and fourth transfer transistors, and first and second reset transistors.

According to at least one example embodiment, the plurality of transistors include first and second selection transistors, and first and second amplification transistors.

According to at least one example embodiment, the photoelectric conversion region comprises a main portion and an extension portion that extends from the main portion, and the first side of the photoelectric conversion region includes the extension portion.

According to at least one example embodiment, the extension portion includes a first edge, a second edge, and a third edge connecting the first edge and the second edge, and the first transfer transistor is located at the first edge, the second transfer transistor is located at the second edge, and the third transfer transistor is located at the third edge.

According to at least one example embodiment, the third transistors for at least some of the plurality of pixels share drain regions.

According to at least one example embodiment, in the plan view, the charge transfer sections of neighboring pixels align with one another along a second axis that is perpendicular to the first axis.

According to at least one example embodiment, an impurity concentration of a portion of the photoelectric conversion region that is closest to the first transfer transistor and the second transfer transistor is greater than an impurity concentration of a portion of the photoelectric conversion region that is furthest from the first transfer transistor and the second transfer transistor.

According to at least one example embodiment, the first axis passes through a center of the pixel.

At least one example embodiment is directed to a system including a light source, and an imaging device including a pixel array including a plurality of pixels. Each pixel includes a photoelectric conversion region that converts incident light into electric charge, and a charge transfer section coupled to the photoelectric conversion region and having line symmetry along a first axis in a plan view. The charge transfer section includes a first transfer transistor coupled to a first floating diffusion and the photoelectric conversion region and located at a first side of the photoelectric conversion region, and a second transfer transistor coupled to a second floating diffusion and the photoelectric conversion region and located at the first side of the photoelectric conversion region.

According to at least one example embodiment, the charge transfer section includes a third transfer transistor coupled to an overflow region and located at the first side of the photoelectric conversion region and between the first transfer transistor and the second transfer transistor.

According to at least one example embodiment, the first axis passes through a gate of the third transfer transistor.

According to at least one example embodiment the gate of the third transfer transistor is positioned further away from a center of the pixel than a gate of the first transfer transistor and a gate of the second transfer transistor.

At least one example embodiment is directed to a system including a light source, and an imaging device including a pixel array including a plurality of pixels. Each pixel includes a photoelectric conversion region that converts incident light into electric charge, and a charge transfer section coupled to the photoelectric conversion region and having line symmetry along a first axis in a plan view. The charge transfer section includes a first transfer transistor coupled to a first floating diffusion and the photoelectric conversion region and located at a first side of the photoelectric conversion region, and a second transfer transistor coupled to a second floating diffusion and the photoelectric conversion region and located at the first side of the photoelectric conversion region. The system includes a signal processor configured to determine a distance to an object based on the electric charge.

DETAILED DESCRIPTION

Figure 1:
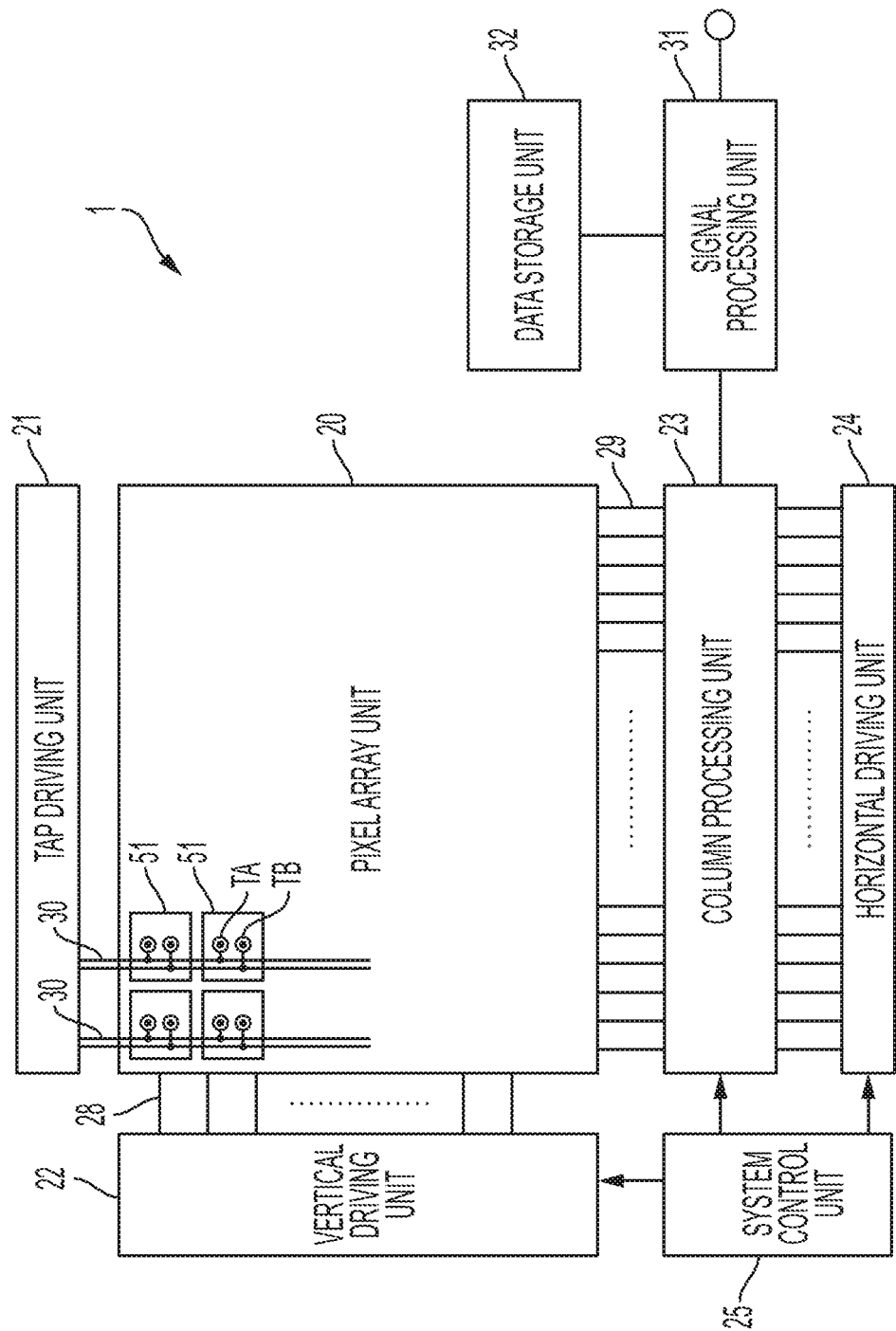
FIG. 1 is a block diagram of an imaging device according to at least one example embodiment.

FIG. 1 is a block diagram of an imaging device according to at least one example embodiment.

The pixel 51 includes a photoelectric conversion region PD, such as a photodiode or other light sensor, transfer transistors TG0 and TG1, floating diffusion regions FD0 and FD1, reset transistors RST0 and RST1, amplification transistors AMP0 and AMP1, and selection transistors SEL0 and SEL1.

The imaging device 1 shown in FIG. 1 may be an imaging sensor of a front or rear surface irradiation type, and is provided, for example, in an imaging apparatus having a ranging function (or distance measuring function).

The imaging device 1 has a pixel array unit (or pixel array or pixel section) 20 formed on a semiconductor substrate (not shown) and a peripheral circuit integrated on the same semiconductor substrate the same as the pixel array unit 20. The peripheral circuit includes, for example, a tap driving unit (or tap driver) 21, a vertical driving unit (or vertical driver) 22, a column processing unit (or column processing circuit) 23, a horizontal driving unit (or horizontal driver) 24, and a system control unit (or system controller) 25.

The imaging device element 1 is further provided with a signal processing unit (or signal processor) 31 and a data storage unit (or data storage or memory or computer readable storage medium) 32. Note that the signal processing unit 31 and the data storage unit 32 may be mounted on the same substrate as the imaging device 1 or may be disposed on a substrate separate from the imaging device 1 in the imaging apparatus.

The pixel array unit 20 has a configuration in which pixels 51 that generate charge corresponding to a received light amount and output a signal corresponding to the charge are two-dimensionally disposed in a matrix shape of a row direction and a column direction. That is, the pixel array unit 20 has a plurality of pixels 51 that perform photoelectric conversion on incident light and output a signal corresponding to charge obtained as a result. Here, the row direction refers to an arrangement direction of the pixels 51 in a horizontal direction, and the column direction refers to the arrangement direction of the pixels 51 in a vertical direction.

The row direction is a horizontal direction in the figure, and the column direction is a vertical direction in the figure.

The pixel 51 receives light incident from the external environment, for example, infrared light, performs photoelectric conversion on the received light, and outputs a pixel signal according to charge obtained as a result. The pixel 51 may include a first charge collector that detects charge obtained by the photoelectric conversion PD by applying a predetermined voltage (first voltage) to the pixel 51, and a second charge collector that detects charge obtained by the photoelectric conversion by applying a predetermined voltage (second voltage) to the pixel 51. The first and second charge collector may include tap A and tap B, respectively. Although two charge collectors are shown (i.e., tap A, and tap B), more or fewer charge collectors may be included according to design preferences.

The tap driving unit 21 supplies the predetermined first voltage to the first charge collector of each of the pixels 51 of the pixel array unit 20 through a predetermined voltage supply line 30, and supplies the predetermined second voltage to the second charge collector thereof through the predetermined voltage supply line 30. Therefore, two voltage supply lines 30 including the voltage supply line 30 that transmits the first voltage and the voltage supply line 30 that transmits the second voltage are wired to one pixel column of the pixel array unit 20.

In the pixel array unit 20, with respect to the pixel array of the matrix shape, a pixel drive line 28 is wired along a row direction for each pixel row, and two vertical signal lines 29 are wired along a column direction for each pixel column. For example, the pixel drive line 28 transmits a drive signal for driving when reading a signal from the pixel. Note that, although FIG. 1 shows one wire for the pixel drive line 28, the pixel drive line 28 is not limited to one. One end of the pixel drive line 28 is connected to an output end corresponding to each row of the vertical driving unit 22.

The vertical driving unit 22 includes a shift register, an address decoder, or the like. The vertical driving unit 22 drives each pixel of all pixels of the pixel array unit 20 at the same time, or in row units, or the like. That is, the vertical driving unit 22 includes a driving unit that controls operation of each pixel of the pixel array unit 20, together with the system control unit 25 that controls the vertical driving unit 22.

The signals output from each pixel 51 of a pixel row in response to drive control by the vertical driving unit 22 are input to the column processing unit 23 through the vertical signal line 29. The column processing unit 23 performs a predetermined signal process on the pixel signal output from each pixel 51 through the vertical signal line 29 and temporarily holds the pixel signal after the signal process.

Specifically, the column processing unit 23 performs a noise removal process, a sample and hold (S/H) process, an analog to digital (AD) conversion process, and the like as the signal process.

The horizontal driving unit 24 includes a shift register, an address decoder, or the like, and sequentially selects unit circuits corresponding to pixel columns of the column processing unit 23. The column processing unit 23 sequentially outputs the pixel signals obtained through the signal process for each unit circuit, by a selective scan by the horizontal driving unit 24.

The system control unit 25 includes a timing generator or the like that generates various timing signals and performs drive control on the tap driving unit 21, the vertical driving unit 22, the column processing unit 23, the horizontal driving unit 24, and the like, on the basis of the various generated timing signals.

The signal processing unit 31 has at least a calculation process function and performs various signal processing such as a calculation process on the basis of the pixel signal output from the column processing unit 23. The data storage unit 32 temporarily stores data necessary for the signal processing in the signal processing unit 31. The signal processing unit 31 may control overall functions of the imaging device 1. For example, the tap driving unit 21, the vertical driving unit 22, the column processing unit 23, the horizontal driving unit 24, and the system control unit 25, and the data storage unit 32 may be under control of the signal processing unit 31. The signal processing unit or signal processor 31, alone or in conjunction with the other elements of FIG. 1, may control all operations of the systems discussed in more detail below with reference to the accompanying figures. Thus, the terms "signal processing unit" and "signal processor" may also refer to a collection of elements 21, 22, 23, 24, 25, and/or 31.

Figure 2:
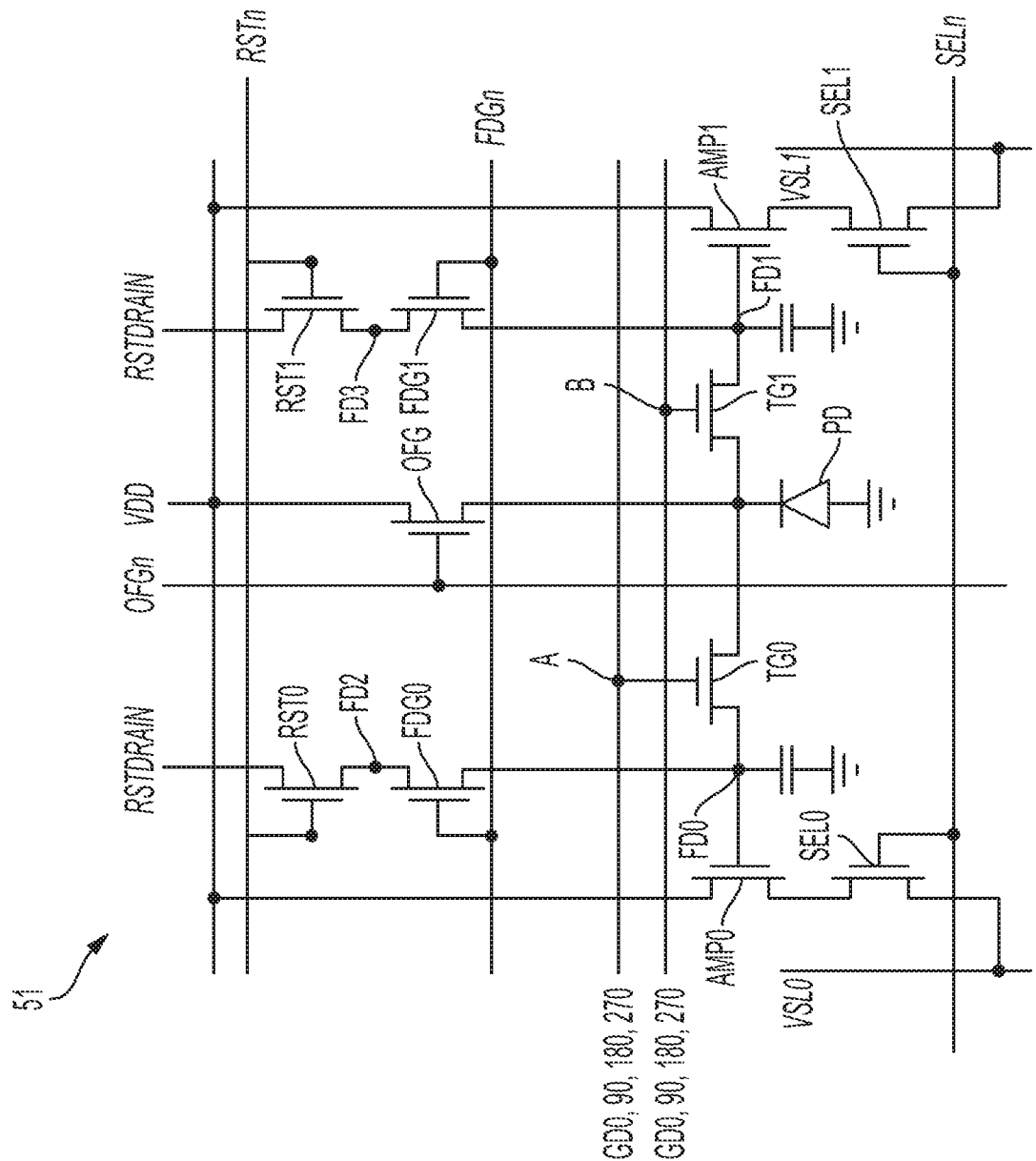
FIG. 2 illustrates an example schematic of a pixel from FIG. 1 according to at least one example embodiment.

FIG. 2 illustrates an example schematic of a pixel 51 from FIG. 1. The pixel 51 includes a photoelectric conversion region PD, such as a photodiode or other light sensor, transfer transistors TG0 and TG1, floating diffusion regions FD0 and FD1, reset transistors RST0 and RST1, amplification transistors AMP0 and AMP1, and selection transistors SEL0 and SEL1. The pixel 51 may further include an overflow transistor OFG, transfer transistors FDG0 and FDG1, and floating diffusion regions FD2 and FD3.

The pixel 51 may be driven according to control signals or transfer signals GD0, GD90, GD180 and GD270 applied to gates or taps A/B of transfer transistors TG0/TG1, reset signal RSTDRAIN, overflow signal OFGn, power supply signal VDD, selection signal SELn, and vertical selection signals VSL0 and VSL1. These signals are provided by various elements from FIG. 1, for example, the tap driver 21, vertical driver 22, system controller 25, etc.

As shown in FIG. 2, the transfer transistors TG0 and TG1 are coupled to the photoelectric conversion region PD and have taps A/B that transfer charge as a result of applying transfer signals.

These transfer signals GD0, GD90, GD180, and GD270 may have different phases relative to a phase of a modulated signal from a light source (e.g., phases that differ 0 degrees, 90 degrees, 180 degrees, and/or 270 degrees). The transfer signals may be applied in a manner that allows for depth information (or pixel values) to be captured in a desired number of frames (e.g., one frame, two frames, four frames, etc.). One of ordinary skill in the art would understand how to apply the transfer signals in order to use the collected charge to calculate a distance to an object.

It should be appreciated that the transfer transistors FDG0/FDG1 and floating diffusions FD2/FD3 are included to expand the charge capacity of the pixel 51, if desired. However, these elements may be omitted or not used, if desired. The overflow transistor OFG is included to transfer overflow charge from the photoelectric conversion region PD, but may be omitted or unused if desired. Further still, if only one tap is desired, then elements associated with the other tap may be unused or omitted (e.g., TG1, FD1, FDG1, RST1, SEL1, AMP1).

It should be understood that FIGS. 3-20 show substantially accurate relative positional relationships of the elements depicted therein and can be relied upon as support for such positional relationships. For example, the figures provide support for selection transistors SEL and amplification transistors AMP being aligned with one another in a vertical direction, while transistors FDG and RST are aligned with one another in the vertical direction. As another example, the figures provide support for a transistor on a right side of a figure being aligned with a transistor on a left side of a figure in the horizontal direction. As yet another example, the figures are generally accurate with respect to showing positions of overlapping elements.

In addition, where reference to general element or set of elements is appropriate instead of a specific element, the description may refer to the element or set of elements by its root term. For example, when reference to a specific transfer transistor TG0 or TG1 is not necessary, the description may refer to the transfer transistor(s) "TG."

FIGS. 3-7 illustrate an example overview of inventive concepts.

Figure 3:
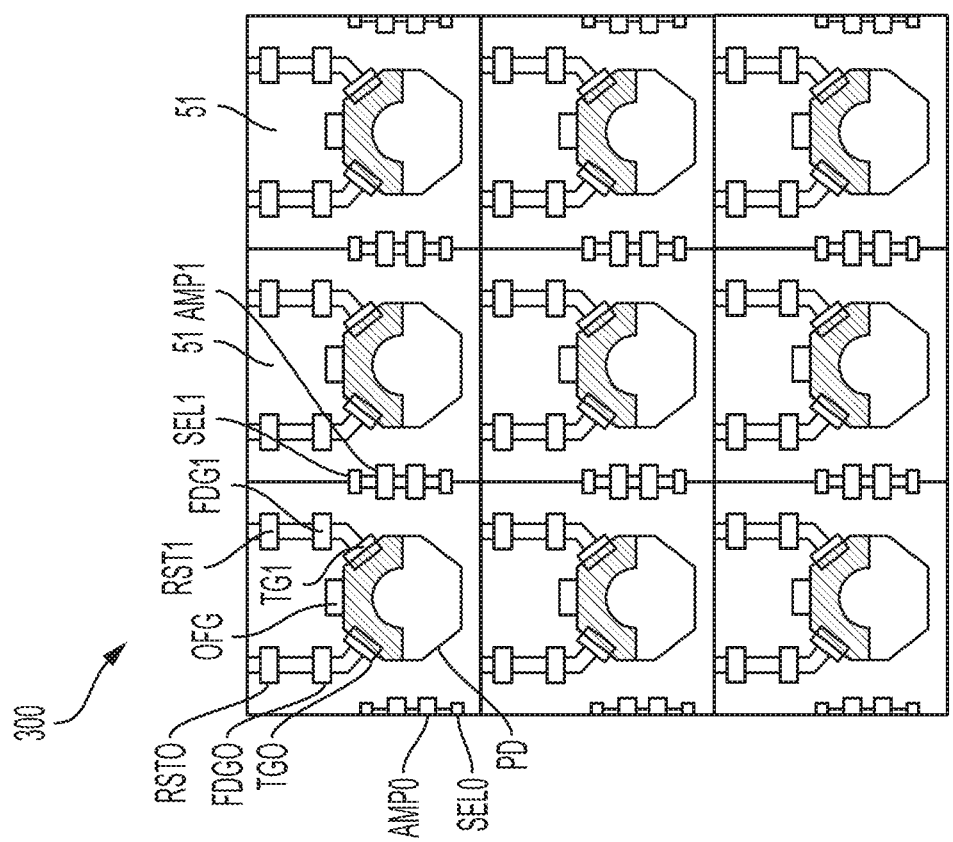
FIG. 3 illustrates a plan view of an array of pixels according to at least one example embodiment.

FIG. 3 illustrates a plan view of an array 300 of pixels 51 in an imaging device 1 according to at least one example embodiment. Nine pixels 51 are shown, but example embodiments are not limited thereto and more or fewer pixels may be included. Each pixel 51 may include a photoelectric conversion region PD (octagonal shape) that converts incident light into electric charge, and each photoelectric conversion region PD may be isolated from a neighboring photoelectric conversion region PD by an isolation structure that reflects and/or blocks light from entering the neighboring photoelectric conversion region PD.

In FIGS. 3-7, it should be appreciated that the transfer transistors TG0/TG1 are on a same side (or same half) of the photoelectric conversion region PD, which may improve charge transfer rates and/or OFG reset times (e.g., to reset the overflow region). In addition, as shown in FIG. 3, an impurity concentration of the photoelectric conversion region may vary across the area of the photoelectric region PD. For example, the impurity concentration may increase in a direction toward TG0, TG1, and OFG, which may result in faster charge transfer to FD0, FD1, and/or the overflow region as well as a fast OFG reset. FIG. 3 shows an example where each photoelectric conversion region PD has a U-shaped region closest to TG0, OFG, and TG1. This U-shaped region may have a higher impurity concentration than a remainder of the photoelectric conversion region PD. The higher concentration impurity region(s) may be created by masks designed to cause a potential gradient that can drive charge from the photoelectric conversion region toward FD0 and/or FD1. Although not explicitly shown in FIGS. 6-21, it should be appreciated that these designs may also include increasing impurity concentrations in a direction toward the transfer transistors TG0/TG1 and overflow transistor OFG.

Figure 4:
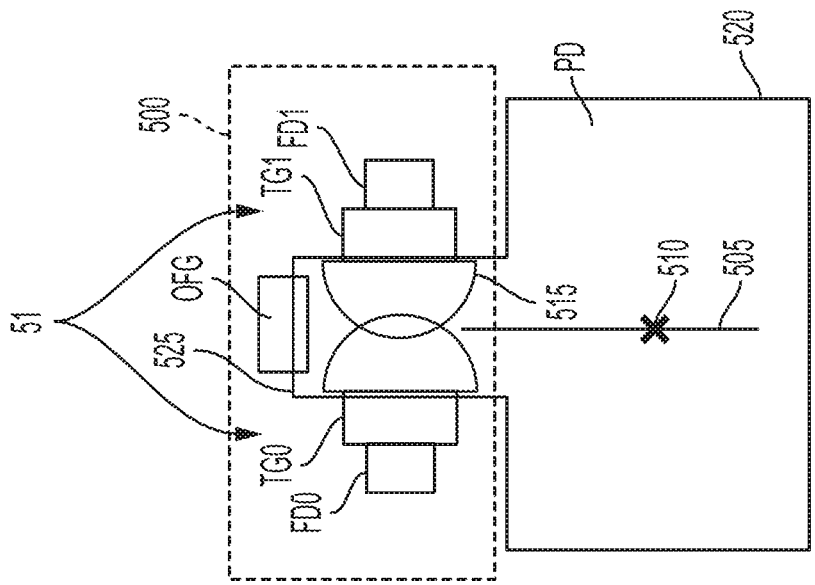
FIG. 4 illustrates a plan view of a portion of a single pixel according to at least one example embodiment.

FIG. 4 illustrates a plan view of a portion of a single pixel 51 from FIG. 3. FIG. 4 illustrates a charge transfer section 400 that includes transistors TG0, TG1, and OFG as well as floating diffusions FD0 and FD1. As shown, the charge transfer section 400 has line symmetry along an axis 405 that passes through a center 410 of the pixel 51. In general, the center 410 may be a center of the photoelectric conversion region PD. However, the center 410 may also be a center of the overall pixel or pixel region that includes the photoelectric conversion region and one or more additional transistors from FIG. 2. That is, the center of a pixel may be defined by drawing a boundary (e.g., an arbitrary boundary) around the photoelectric conversion region and, optionally, one or more transistors of a pixel 51, and then selecting a point in the middle of the pixel when measured in a horizontal direction. Additionally or alternatively, depending on the embodiment, the center may be determined as the point where an axis passing therethrough leads to line symmetry for a charge transfer section. As discussed in more detail below, the charge transfer section of a pixel may have line symmetry and each pixel or pixel region that includes the charge transfer section and one or more transistors may have line symmetry.

Throughout this description, charge transfer section generally refers transistors TG0 and TG1 with or without transistor OFG even if not explicitly illustrated in a figure.

Figure 5:
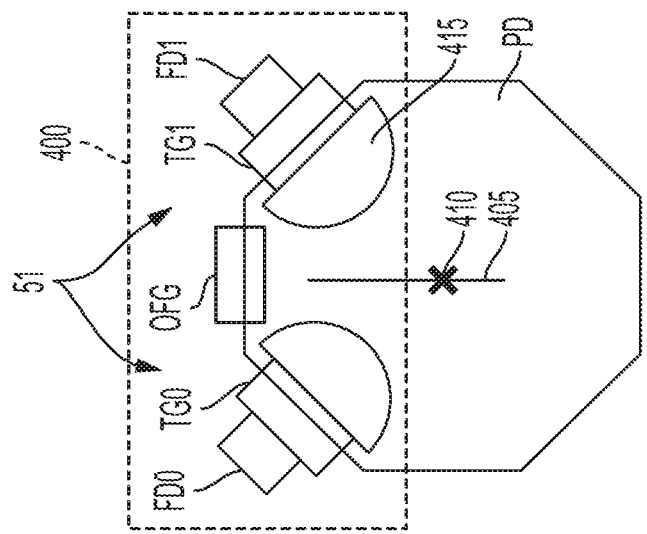
FIG. 5 illustrates a plan view of a portion of a single pixel according to at least one example embodiment.

FIG. 5 illustrates a plan view of a portion of a single pixel 51, where the photoelectric conversion region PD has a different shape form FIG. 1, for example, a rectangular shape with an extension portion that includes a charge transfer section 500. As shown, the charge transfer section 500 has line symmetry along an axis 505 that passes through a center 510 of the pixel 51. Here, the center 510 may be a center of the photoelectric conversion region PD. However, the center 510 may also be a center of the overall pixel region that includes the photoelectric conversion region and one or more additional transistors from FIG. 2. Thus, according to at least one example embodiment, each pixel region may have line symmetry.

Here, it should be appreciated that FIG. 5 further shows that the photoelectric conversion region PD includes a main portion 520 and an extension portion 525 that extends from the main portion 520. FIG. 5 illustrates that the extension portion 525 includes a first edge, a second edge, and a third edge connecting the first edge and the second edge. The transfer transistor TG0 is located at the first edge, the transfer transistor TG1 is located at the second edge, and the overflow transistor (or third transfer transistor) OFG is located at the third edge.

With reference to FIGS. 3-7, each pixel 51 may include two transfer transistors TG0 and TG1 for transferring the electric charge generated by the photoelectric conversion region PD. The transfer transistors TG0/TG1 may be turned on an off in accordance with a respective drive signal generated by a driver (e.g., an element from FIG. 1) so that charge is transferred by TG0 and TG1 at different times, for example. Each pixel 51 may further include two floating diffusions FD0 and FD1 for holding charge transferred by a respective transfer transistor TG0/TG1, and an overflow transistor OFG. The overflow transistor OFG may be transistor that allows for charge overflow from the PD to an overflow region (have a same or similar function as a floating diffusion). The charge captured in the overflow region may be discarded in some cases (e.g., discharged to ground without being readout) or read out as part of the collected charge in other cases. In one example, the charge in the overflow region may be discarded if the charge collected is due to a bright ambient environment or other conditions that create signals that are not of interest. In another example, the charge in the overflow region may be read out if the charge collected represents signals of interest.

Figure 6:
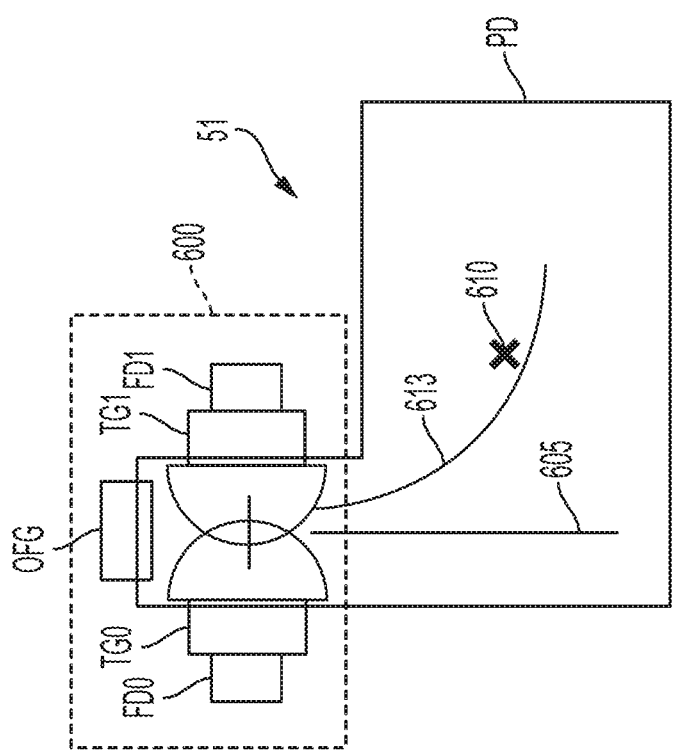
FIG. 6 illustrates a plan view of a portion of a single pixel according to at least one example embodiment.

FIG. 6 illustrates a plan view of a portion of a single pixel 51 according to at least one example embodiment. As shown, a charge transfer section 600 has line symmetry along an axis 605 that is offset from a center 610 of the pixel 51. Here, the center 610 may be a center of the photoelectric conversion region PD. However, the center 610 may also be a center of the overall pixel region that includes the photoelectric conversion region and one or more additional transistors from FIG. 2.

In FIG. 6, it should be appreciated that the pixel region is asymmetrical in that the transfer transistors TG0/TG1, floating diffusions FD0/FD1, and overflow transistor OFG are offset to one side of the photoelectric conversion region PD.

Although FIG. 6 illustrates a left offset, example embodiments may also employ a right offset.

Figure 7:
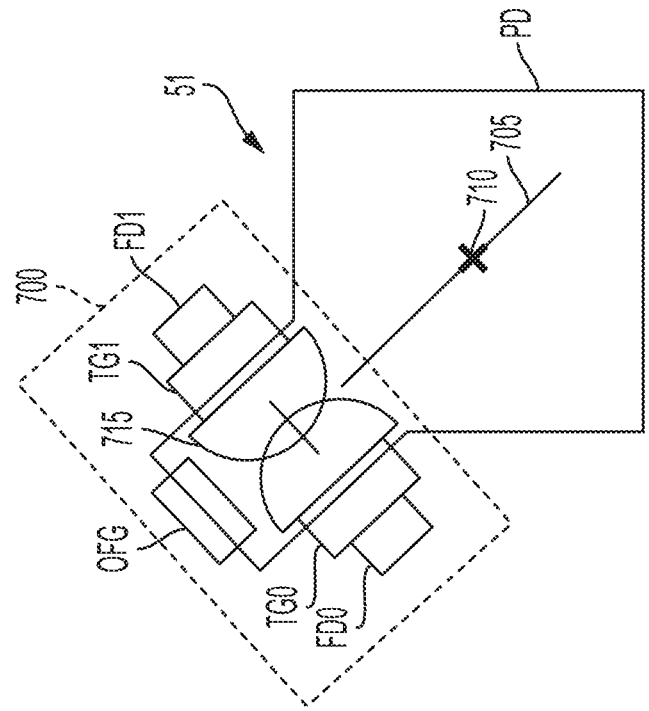
FIG. 7 illustrates a plan view of a portion of a single pixel according to at least one example embodiment.

FIG. 7 illustrates a plan view of a portion of a single pixel 51 according to at least one example embodiment. As shown, the charge transfer section 700 has line symmetry along an axis 705 that passes through a center 710 of the pixel 51. Here, the center 710 may be a center of the photoelectric conversion region PD. However, the center 710 may also be a center of the overall pixel region that includes the photoelectric conversion region and one or more additional transistors from FIG. 2. Thus, according to at least one example embodiment, each pixel region may have line symmetry (e.g., diagonal line symmetry).

FIGS. 4-7 further illustrate modulation areas 415, 515, 615, and 715, which are areas (e.g., doped areas) near gates of transistors TG0 and TG1 that may receive control signals to assist with channeling charge toward TG0 or TG1. The charge separation efficiency, that is, modulation contrast between an active area and inactive area is referred to as Cmod. Cmod is calculated by $\{|I0-I1|/(I0+I1)\} \times 100$, where I0 is a signal detected in one of the two taps TG0 or TG1, and I1 is a signal detected in the other of the two taps TG0 or TG1. In general, it is desired for Cmod to be high and/or matched between taps TG0/TG1 to improve image quality. Because the pixel designs of FIGS. 4-7 have charge transfer sections with line symmetry, Cmod for each tap TG0 and TG1 is matched or closely matched. In addition, the positions of transistors TG0, TG1, and OFG result in fast charge transfer operations for transistors TG0 and TG1 as well as fast reset operations for transistor OFG.

Although not explicitly illustrated, each photoelectric conversion region PD in FIGS. 6 and 7 include a main portion and an extension portion as in FIG. 5.

Figure 8:
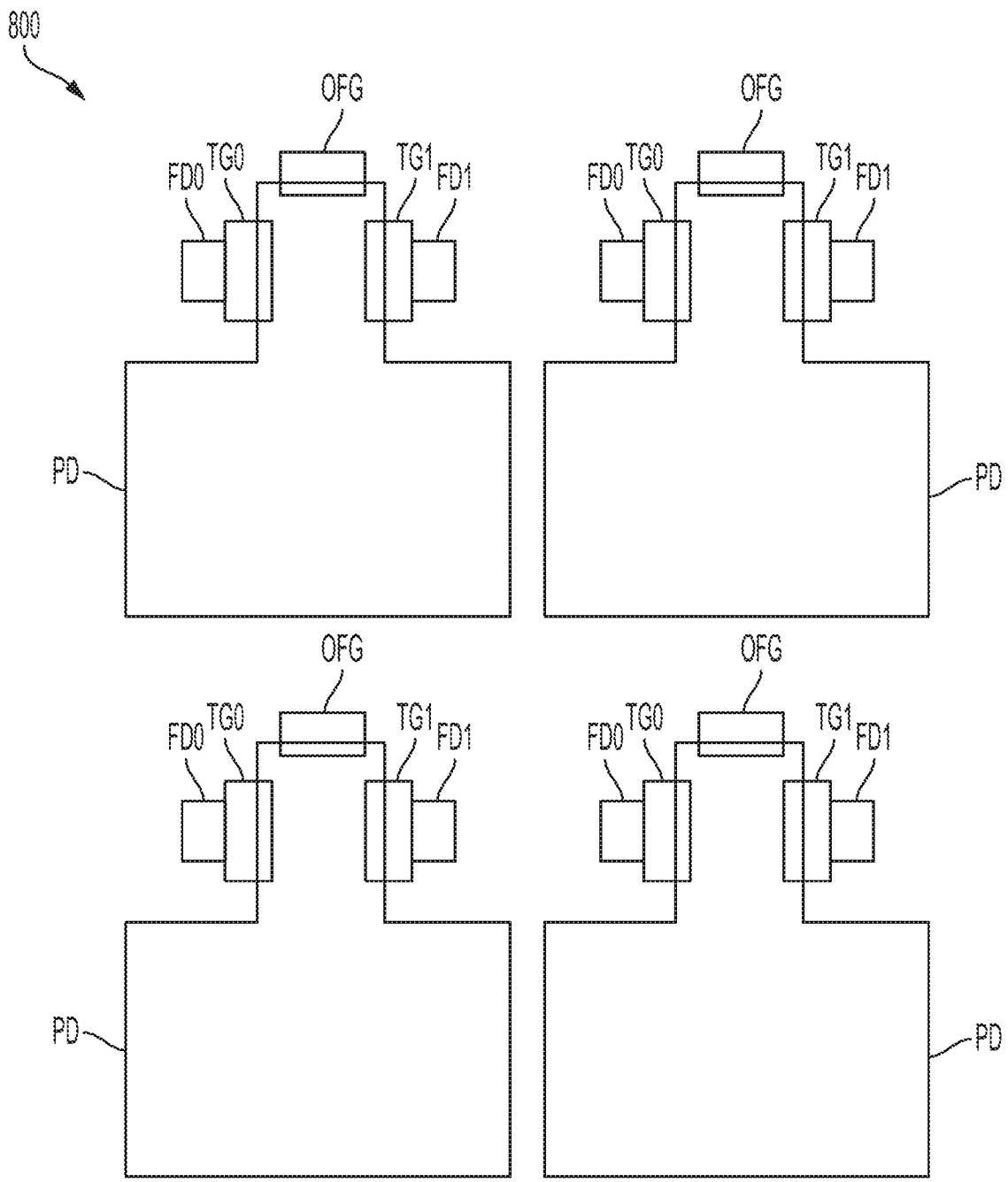
FIG. 8 illustrates an array layout using the pixel design shown in FIG. 5 according to at least one example embodiment.
Figure 9:
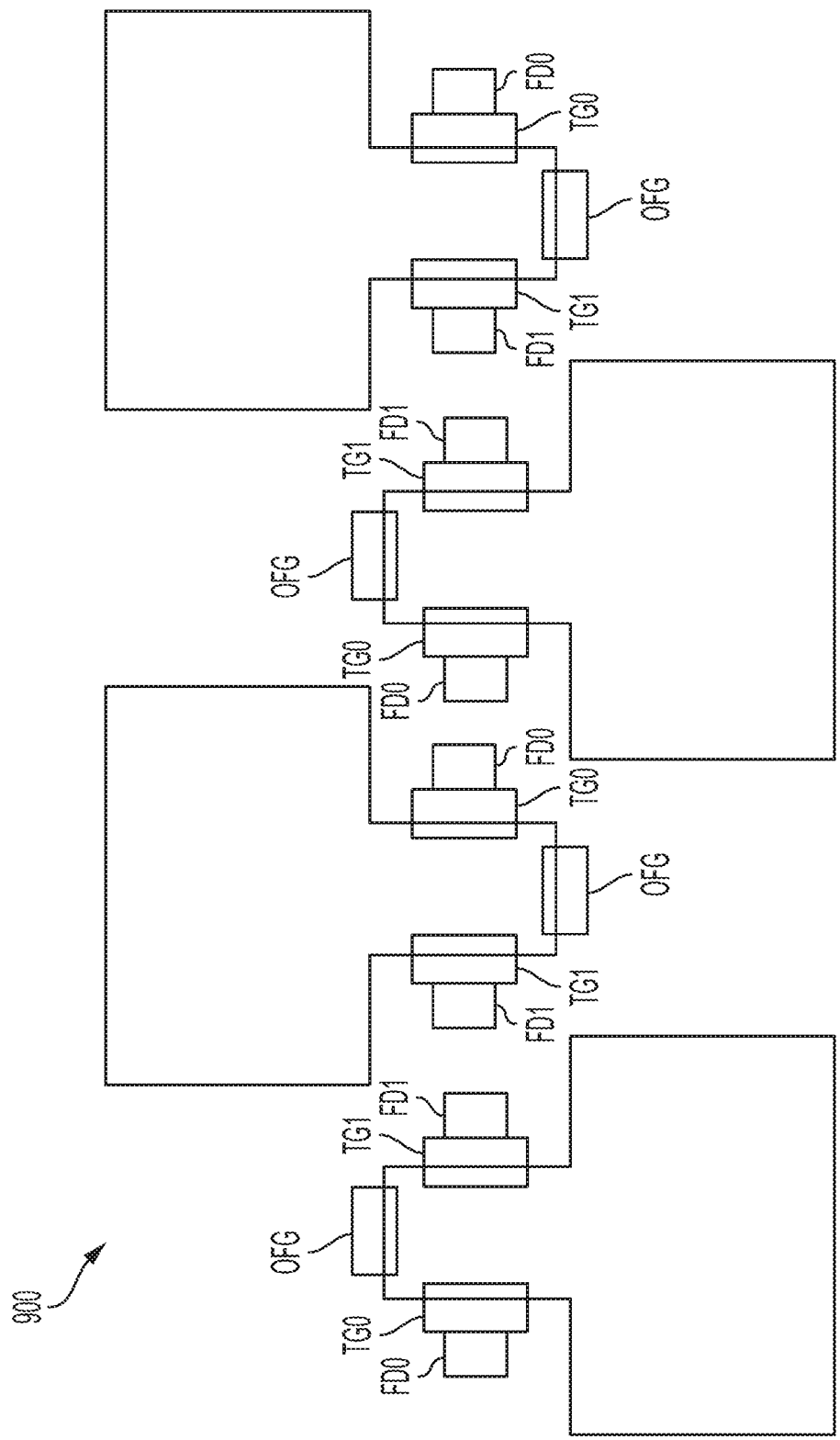
FIG. 9 illustrates an array layout using the pixel design shown in FIG. 5 according to at least one example embodiment.
Figure 10:
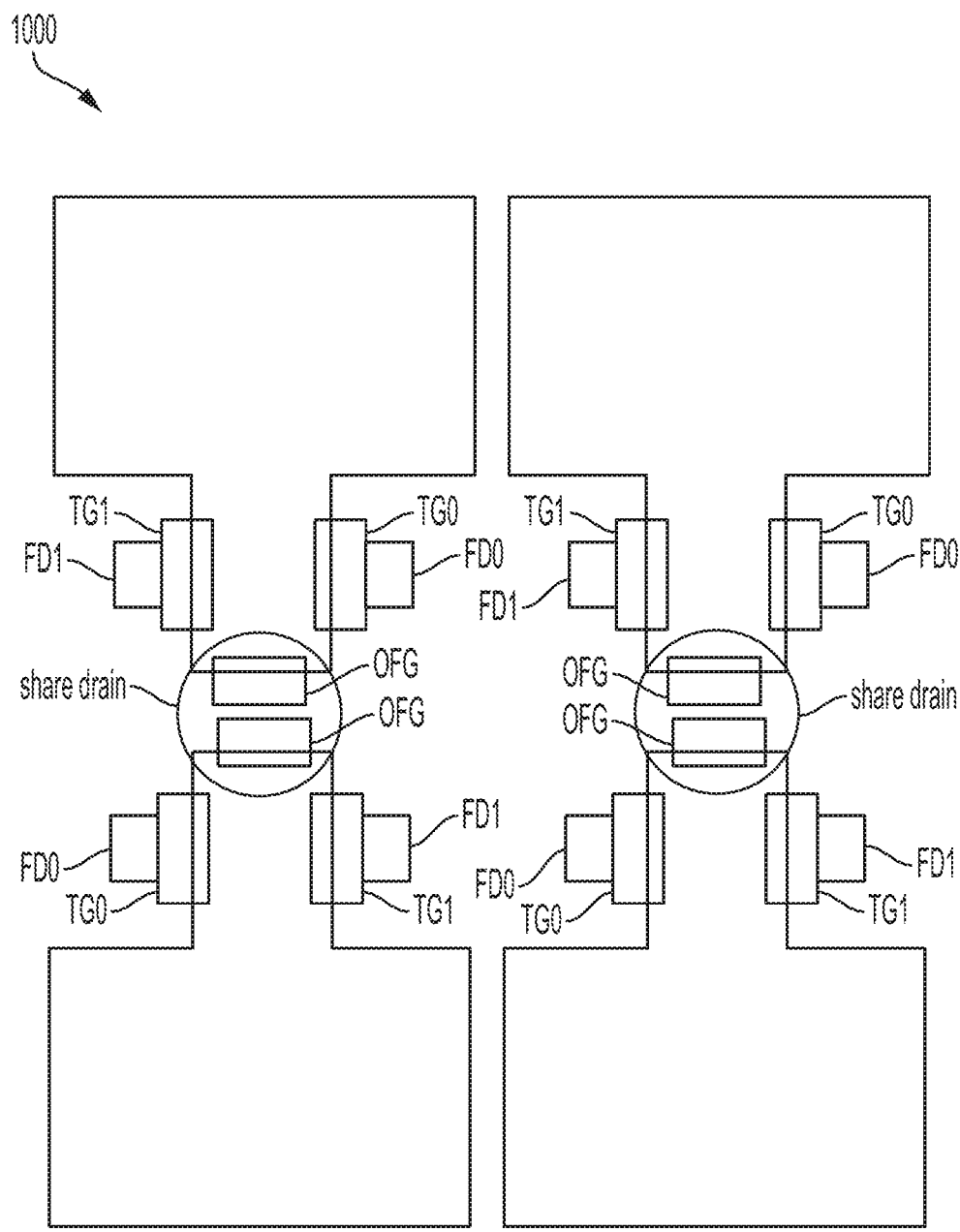
FIG. 10 illustrates an array layout using the pixel design shown in FIG. 5 according to at least one example embodiment.

FIGS. 8-10 illustrate example array layouts 800, 900, and 1000 using the pixel design shown in FIG. 5. In FIGS. 8 and 9 the overflow transistors OFG do not share drains, while in FIG. 10, the overflow transistors OFGs of two photoelectric conversion regions PD are adjacent to one another to allow drain sharing (e.g., overflow region sharing). In FIGS. 8-10, it should be understood that any empty space between PDs may include other elements of a pixel circuit from FIG. 2 (e.g., transistors SEL, AMP, RST, etc.).

FIG. 8 illustrates pixels 51 that are oriented adjacent to one another and such that each charge transfer section 500 of horizontally adjacent pixels 51 are aligned, and such that each charge transfer section 500 of vertically adjacent pixels 51 are aligned.

FIG. 9 illustrates a configuration in which extension portions of each photoelectric conversion region PD are in an interdigitated configuration such that each charge transfer section 500 is aligned along the horizontal direction but alternates a direction of orientation between neighboring pixels 51. The charge transfer sections 500 are aligned such that a straight line passes through transistors TG0/TG1 of each pixel 51.

FIG. 10 illustrates a configuration where extension portions of vertically adjacent pixels face each other in order to allow for overflow transistor OFG drain sharing. The charge transfer sections 500 of horizontally adjacent pixels 51 are aligned with one another in the horizontal direction.

Figure 11:
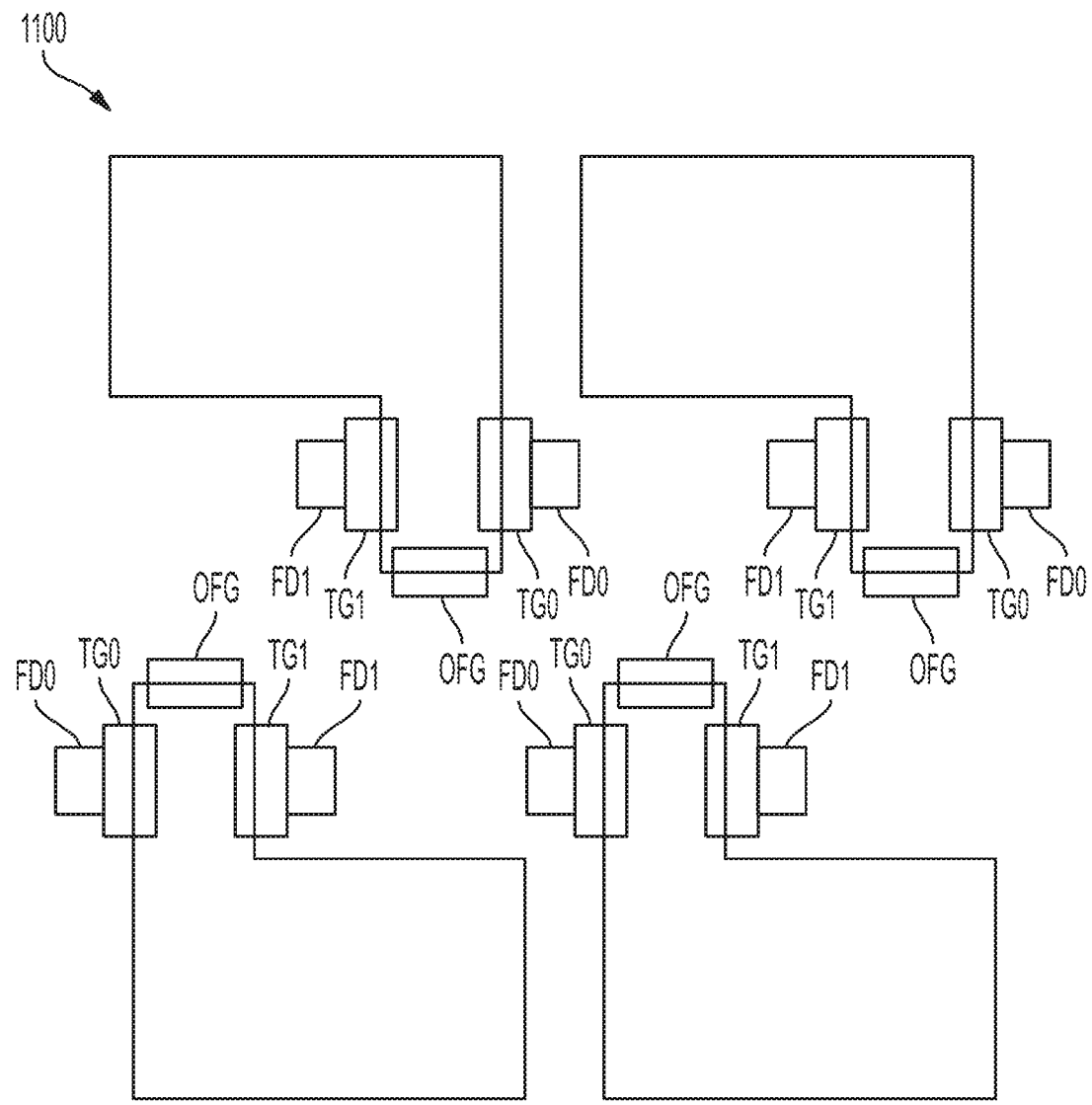
FIG. 11 illustrates an array layout using the pixel design shown in FIG. 6 according to at least one example embodiment.
Figure 12:
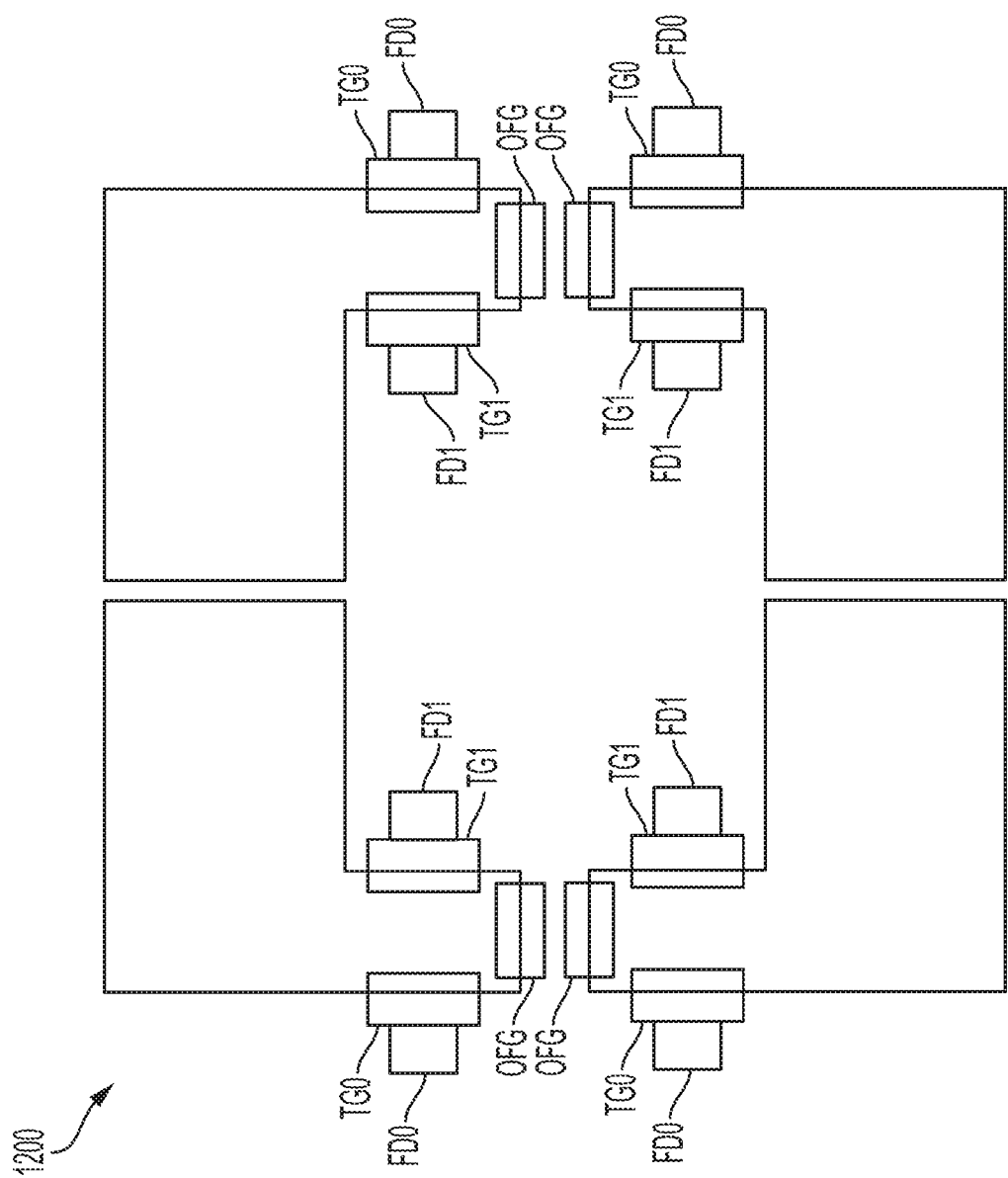
FIG. 12 illustrates an array layout using the pixel design shown in FIG. 6 according to at least one example embodiment.
Figure 13:
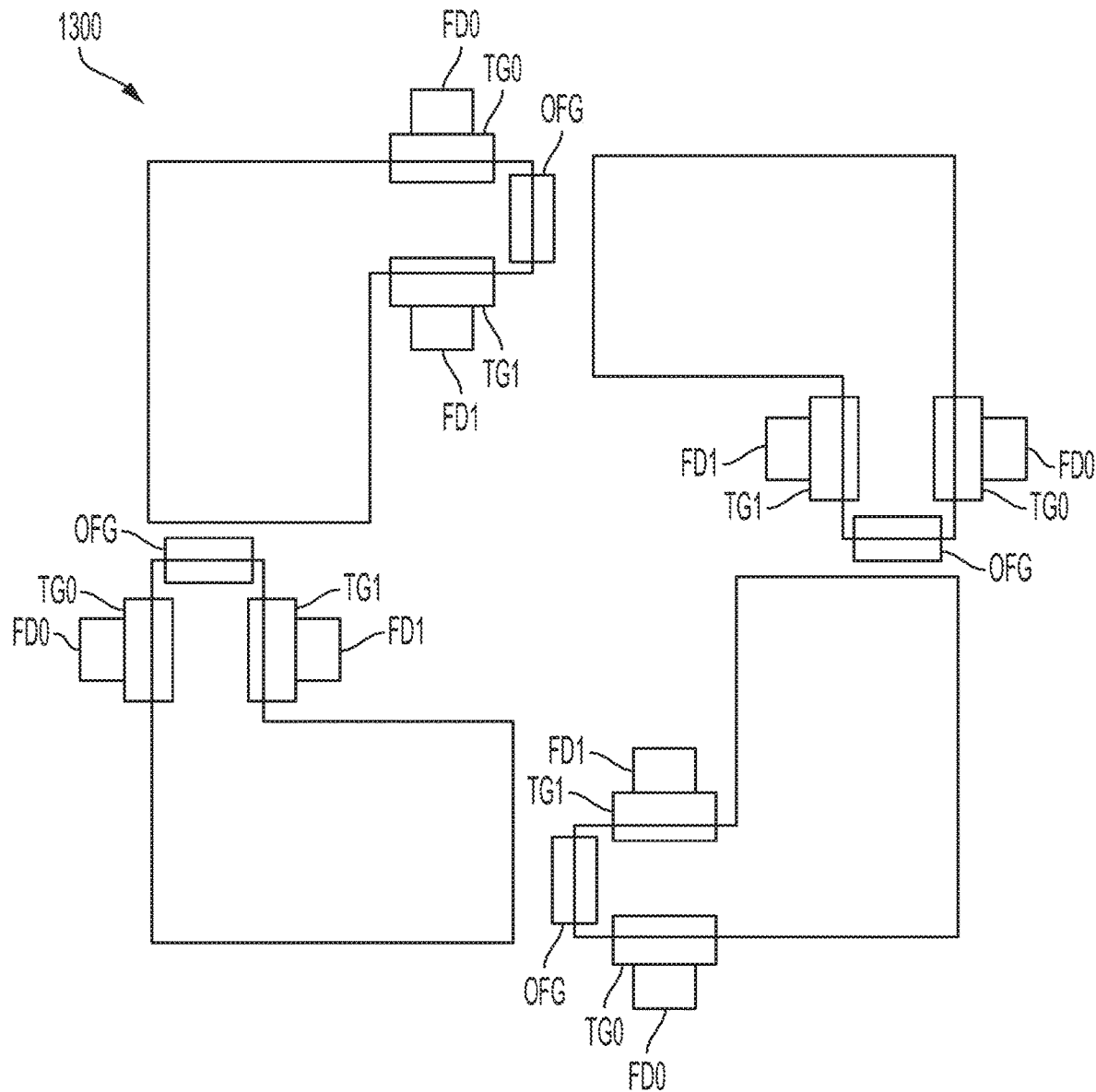
FIG. 13 illustrates an array layout using the pixel design shown in FIG. 6 according to at least one example embodiment.

FIGS. 11-13 illustrate example array layouts 1100, 1200, and 1300 using the pixel design shown in FIG. 6. FIGS. 11 and 13 illustrate examples where the overflow transistors OFGs do not share drains, while FIG. 12 illustrates an example where the overflow transistors OFGs of two photoelectric conversion regions PD are adjacent to one another to allow drain sharing. In FIGS. 12 and 13, although not shown, it should be understood that other elements of pixel circuits from FIG. 2 (e.g., selection transistor, reset transistor, amplification transistor, etc.) may be included in the open central area created by the array layout.

FIG. 11 illustrates a layout where extension portions of each pixel 51 are interdigitated. The layout is such that horizontally neighboring pixels have charge transfer sections 600 aligned with one another in the horizontal direction.

The layout in FIG. 12 illustrates a layout where vertically adjacent pixels 51 have extension portions that face one another in order to allow for sharing drains for overflow transistors OFG. The charge transfer sections 600 of vertically adjacent pixels 51 are aligned with one another in the vertical direction, and the charge transfer sections 600 of horizontally adjacent pixels are aligned with one another in the horizontal direction.

The layout of FIG. 13 arranges pixels 51 such that each extension portion of each PD faces a main portion of another PD.

Figure 14:
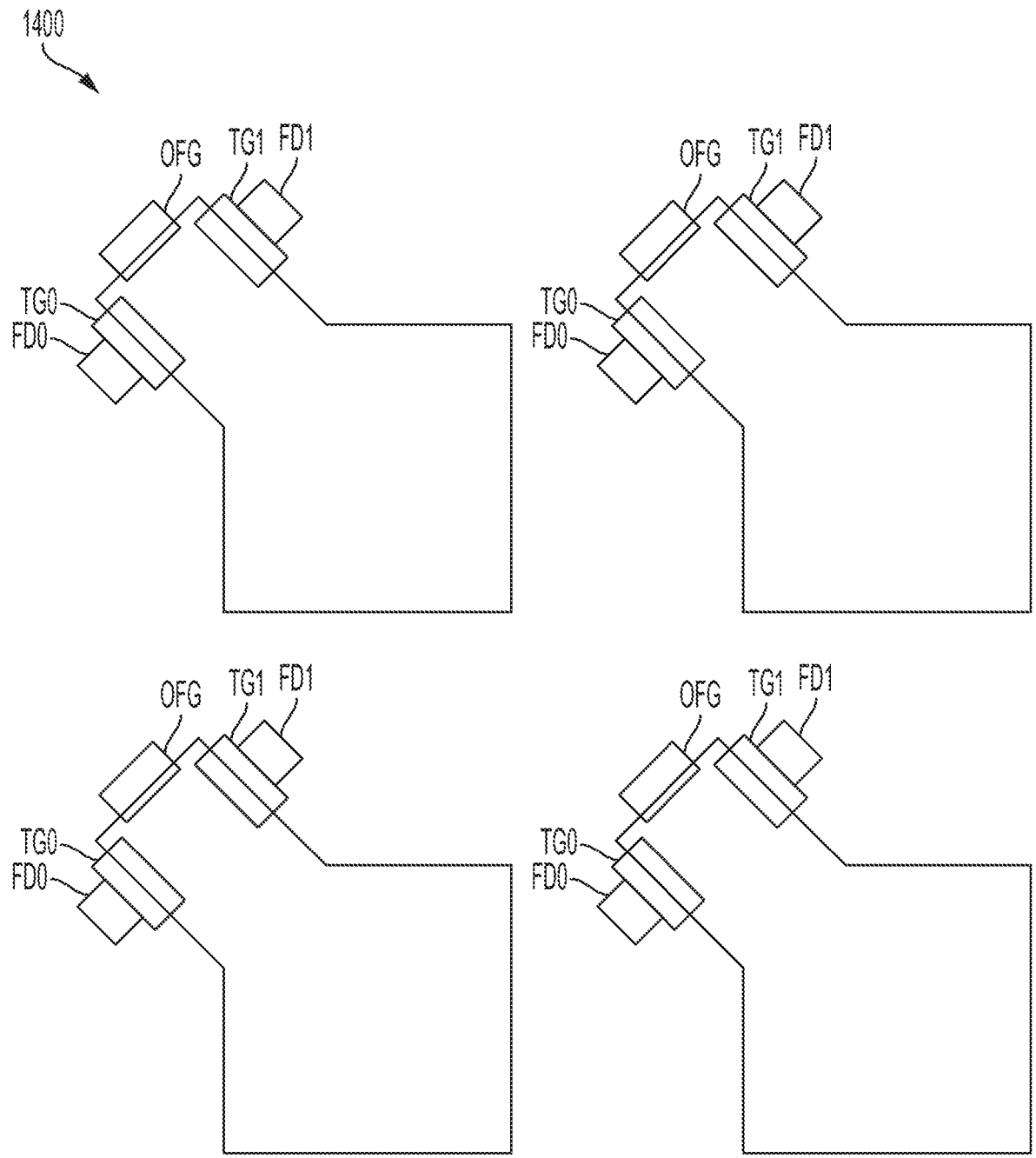
FIG. 14 illustrates an array layout using the pixel design shown in FIG. 7 according to at least one example embodiment.
Figure 15:
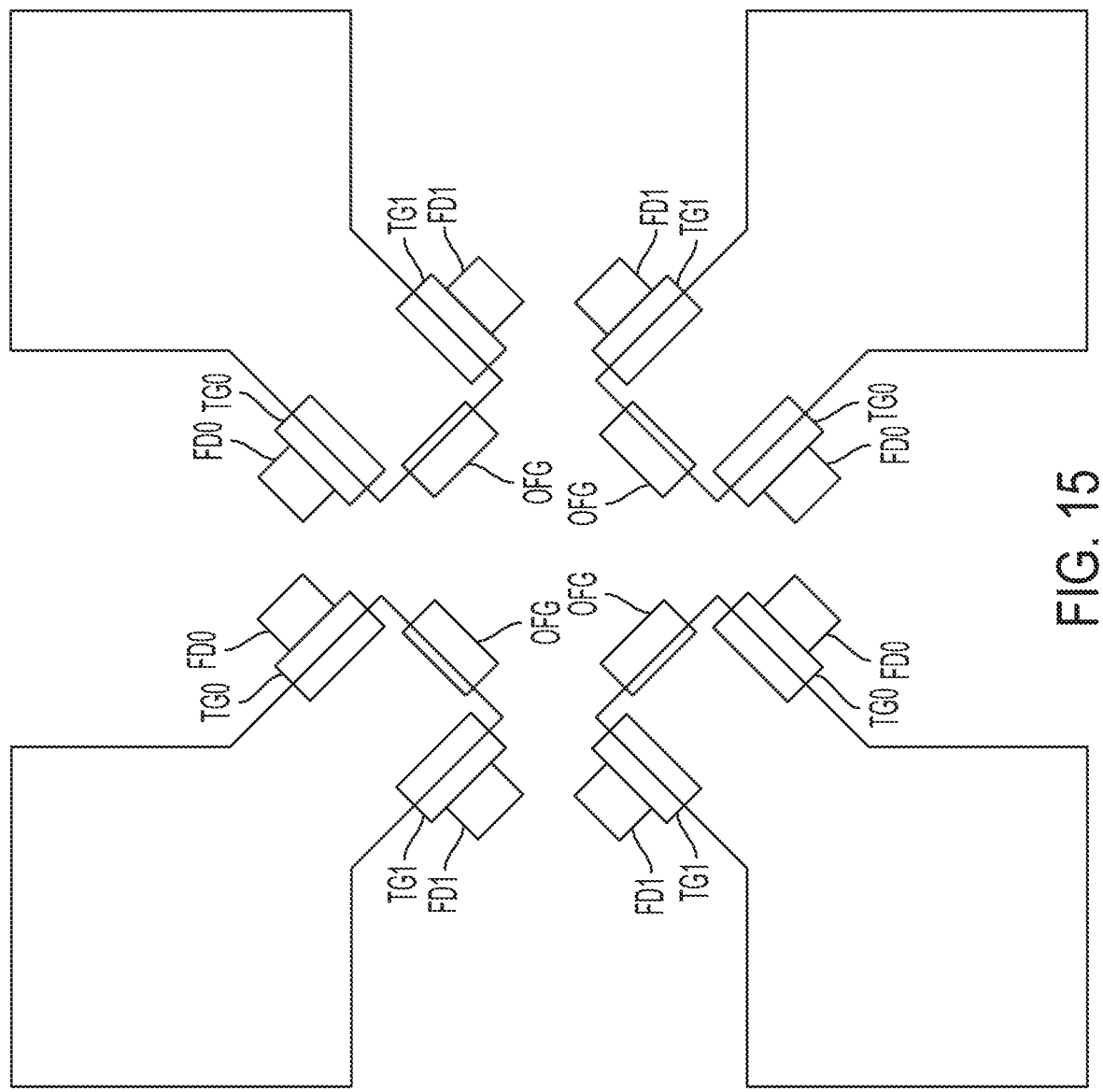
FIG. 15 illustrates an array layout using the pixel design shown in FIG. 7 according to at least one example embodiment.

FIGS. 14 and 15 illustrate example array layouts 1500 and 1600 using the pixel design shown in FIG. 7. In FIG. 14, the overflow transistors OFGs do not share a drain, while in FIG. 15 all four overflow transistors OFGs may share a same drain.

The layout of FIG. 14 shows pixels 51 with extension portions that all extend in a same, diagonal direction, whereas the layout of FIG. 15 shows extension portions that extend in different directions such that drain sharing is possible for all four overflow transistors OFG.

Figure 16:
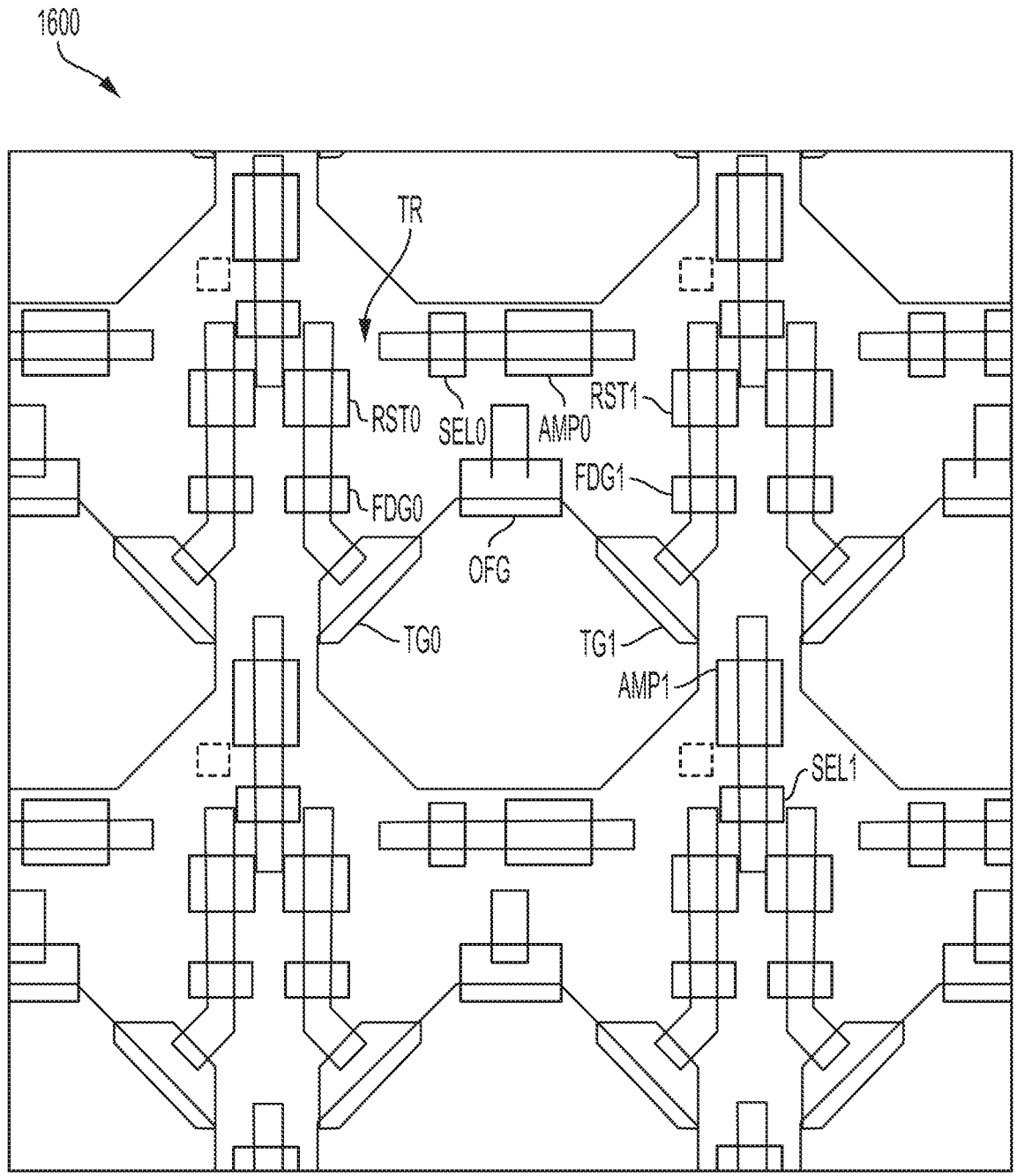
FIG. 16 illustrates an array layout using a pixel design different than that shown in other figures according to at least one example embodiment.

FIG. 16 illustrates an example array layout 1600 using a pixel design different than that shown in other figures. FIG. 16 illustrates a transistor region TR that includes transfer transistors TG0, TG1, overflow transistor OFG, transfer transistors FDG0/FDG1, reset transistors RST0/RST1, selection transistors SEL0/SEL1, and amplification transistors AMP0/AMP1. The photoelectric conversion region PD in FIG. 16 may be used for sensing light in two spectrums (e.g., the visible spectrum and the non-visible spectrum). In FIG. 16, line symmetry exists for a charge transfer section that includes transistors TG0, TG1, and OFG, and also exists for at least some of the transistors in the transistor region TR (e.g., RST0, FDG0, RST1, and FDG1).

Figure 17:
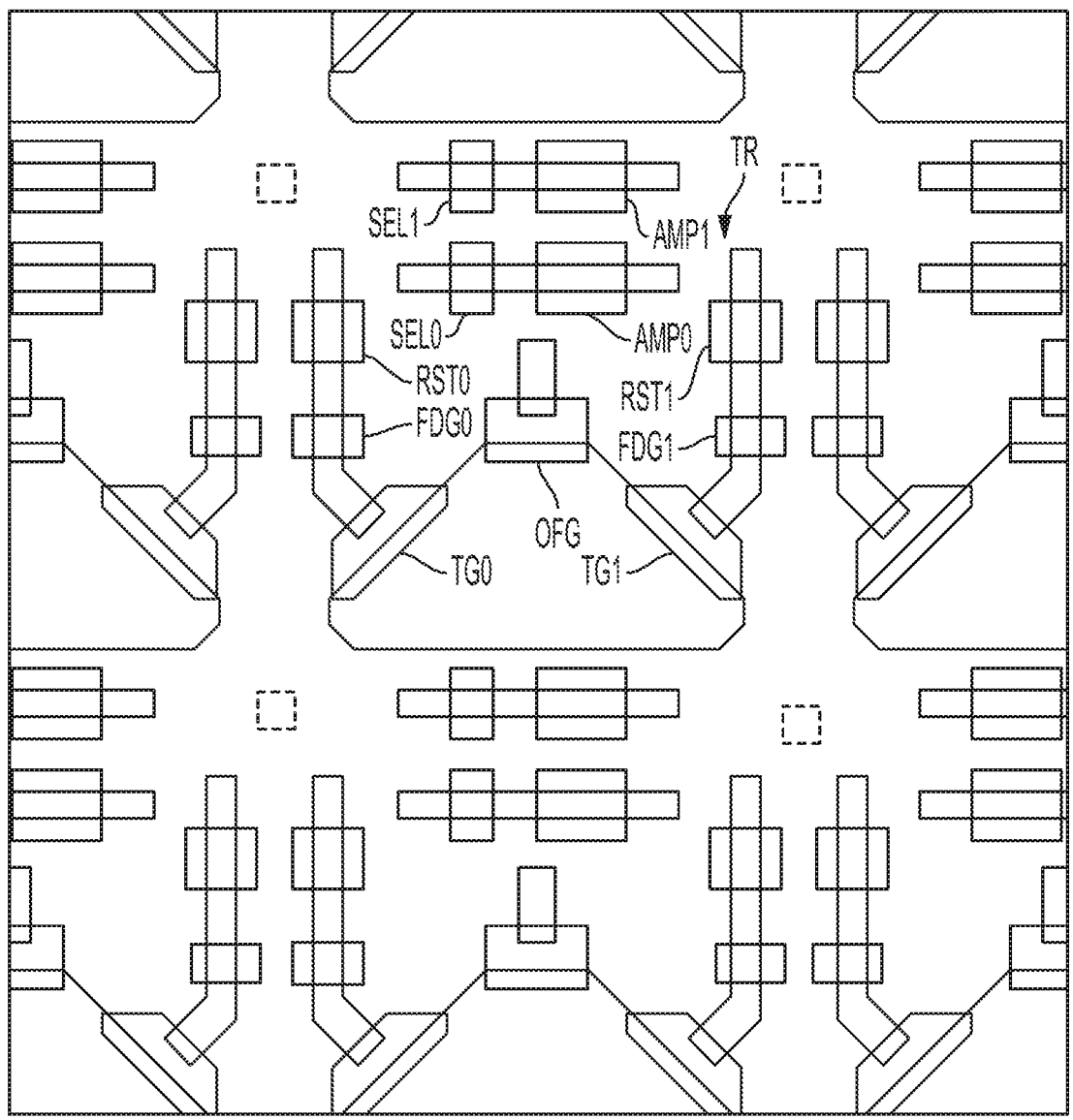
FIG. 17 illustrates an example array layout using a pixel design different than that shown in other figures according to at least one example embodiment.

FIG. 17 illustrates an example array layout 1700 using a pixel design different than that shown in other figures. FIG. 17 includes elements similar to FIG. 16 except that the photoelectric conversion region PD in FIG. 17 is smaller than in FIG. 16. Thus, FIG. 17 may be used for sensing light in a single spectrum (e.g., non-visible spectrum), for example, as a ToF sensor. In FIG. 17, line symmetry exists for a charge transfer section that includes transistors TG0, TG1, and OFG, and also exists for at least some of the transistors in the transistor region TR (e.g., RST0, FDG0, RST1, and FDG1).

Figure 18:
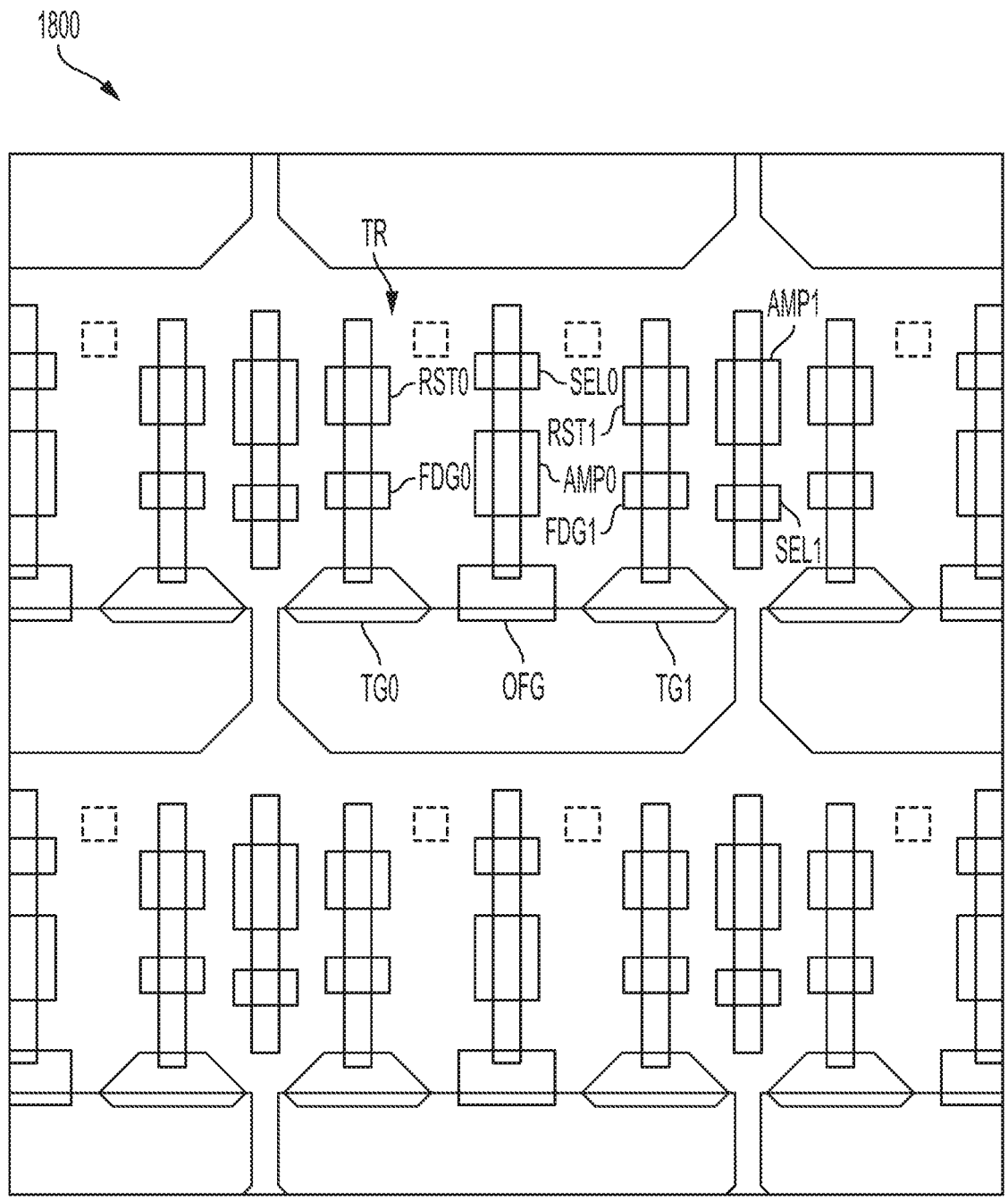
FIG. 18 illustrates an example array layout using a pixel design different than that shown in other figures according to at least one example embodiment.
Figure 19:
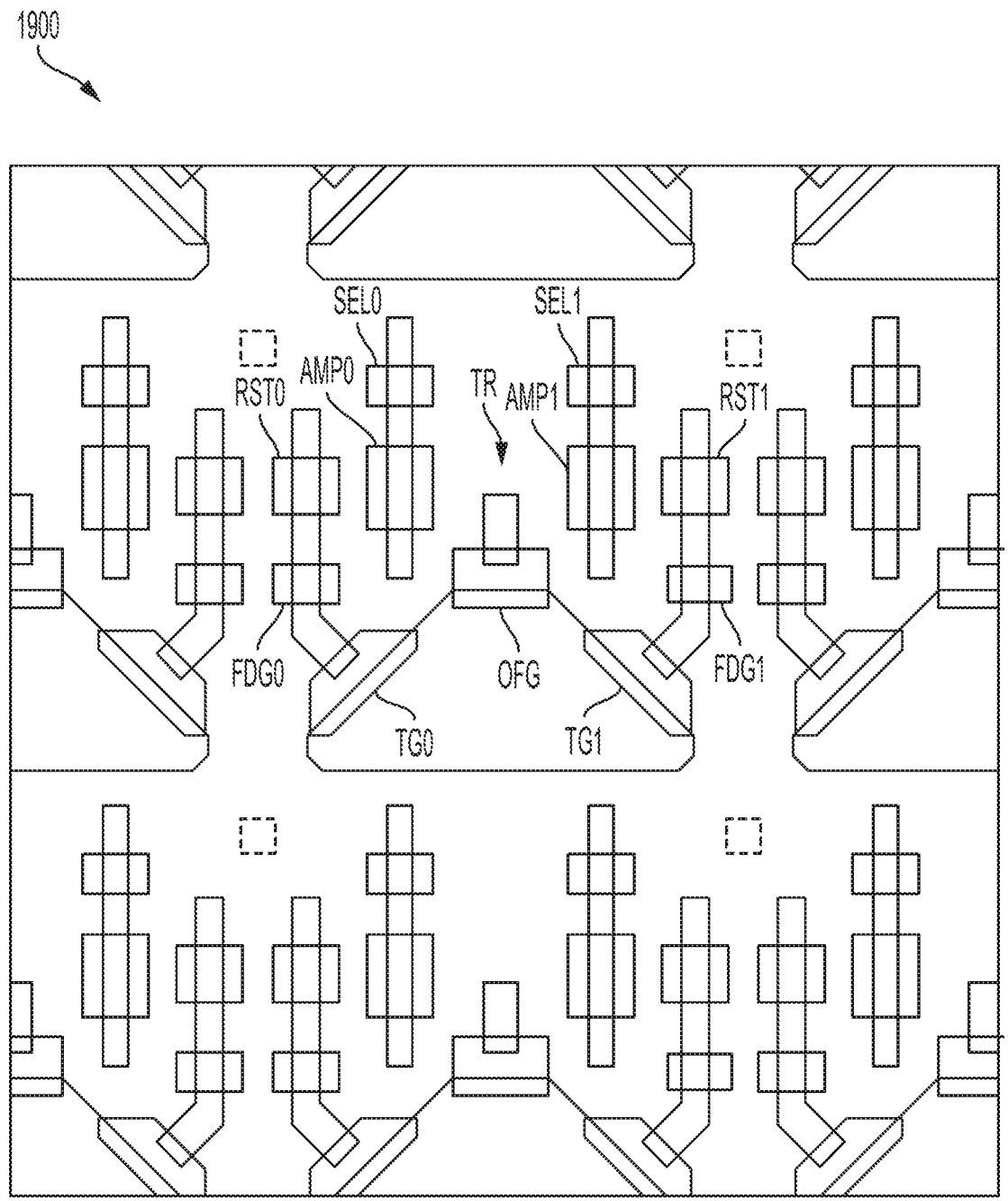
FIG. 19 illustrates an example array layout using a pixel design different than that shown in other figures according to at least one example embodiment.

FIGS. 18 and 19 illustrate additional example array layouts 1800 and 1900 with photoelectric conversion regions PDs having different shapes compared to FIGS. 4-7. In FIG. 18, line symmetry exists for a charge transfer section that includes transistors TG0, TG1, and OFG, and also exists for at least some of the transistors in the transistor region TR (e.g., RST0, FDG0, RST1, FDG1, SEL0, and AMP0). In FIG. 19, line symmetry exists for a charge transfer section that includes transistors TG0, TG1, and OFG, and also exists for all of the transistors in the transistor region TR (e.g., RST0, FDG0, RST1, FDG1, SEL0, AMP0, SEL1, and AMP1).

Figure 20:
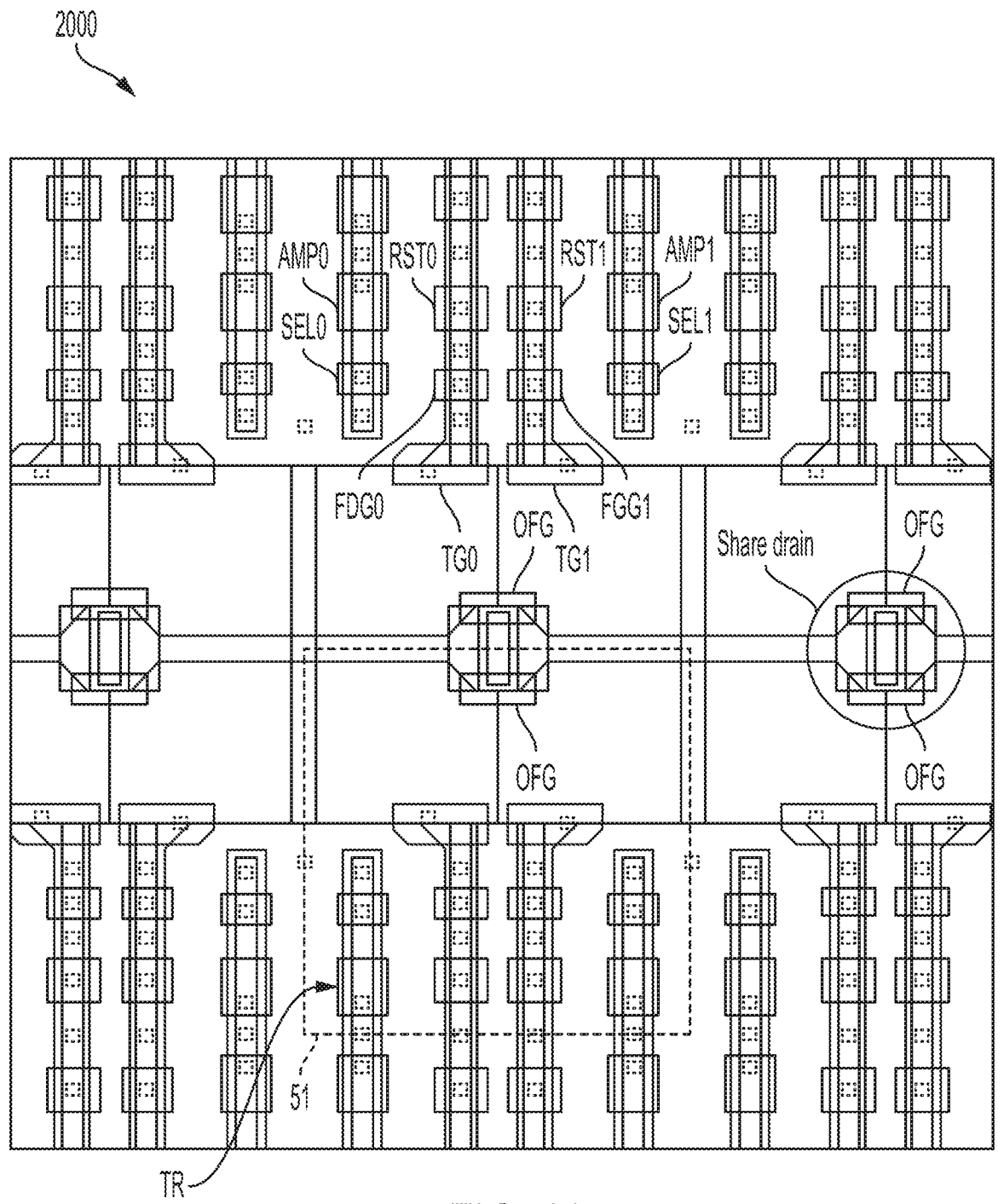
FIG. 20 illustrates an example array layout with drain sharing according to at least one example embodiment.

FIG. 20 illustrates an example array layout with drain sharing for reset transistors RST, OFGs, and power supplies VDD (e.g., applied to RSTs). For example, a reset transistor RST0 for one pixel 51 may share a drain with a reset transistor RST0 of another vertically adjacent pixel. The same is true for neighboring reset transistors RST1. Similarly, an amplification transistor AMP0 of one pixel may share a drain with an amplification transistor AMP0 of another vertically adjacent pixel. The same is true for neighboring amplification transistors AMP1.

FIG. 20 further illustrates how two PDs may share drains for respective overflow transistors OFG. In the example of FIG. 20, overflow transistors OFG are located between photoelectric conversion regions PD of two pixels. In the plan view, each photoelectric conversion region PD is separated from a neighboring PD by isolation material.

Systems/devices that may incorporate the above described imaging device will now be described.

Figure 21:
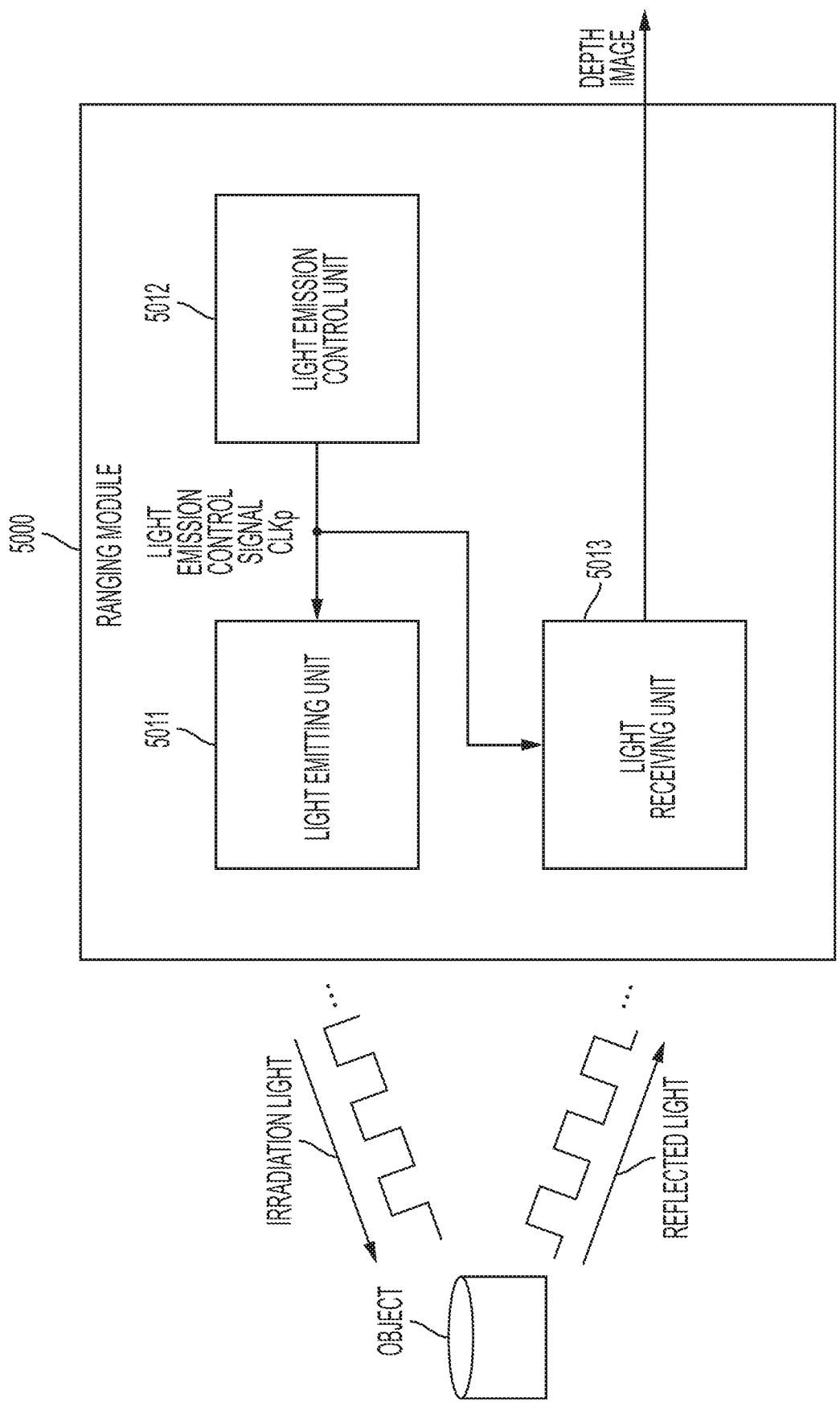
FIG. 21 is a block diagram illustrating an example of a ranging module according to at least one example embodiment.

FIG. 21 is a block diagram illustrating an example of a ranging module according to at least one example embodiment.

The ranging module 5000 includes a light emitting unit 5011, a light emission control unit 5012, and a light receiving unit 5013.

The light emitting unit 5011 has a light source that emits light having a predetermined wavelength, and irradiates the object with irradiation light of which brightness periodically changes. For example, the light emitting unit 5011 has a light emitting diode that emits infrared light having a wavelength in a range of 780 nm to 1000 nm as a light source, and generates the irradiation light in synchronization with a light emission control signal CLKp of a rectangular wave supplied from the light emission control unit 5012.

Note that, the light emission control signal CLKp is not limited to the rectangular wave as long as the control signal CLKp is a periodic signal. For example, the light emission control signal CLKp may be a sine wave.

The light emission control unit 5012 supplies the light emission control signal CLKp to the light emitting unit 5011 and the light receiving unit 5013 and controls an irradiation timing of the irradiation light. A frequency of the light emission control signal CLKp is, for example, 20 megahertz (MHz). Note that, the frequency of the light emission control signal CLKp is not limited to 20 megahertz (MHz), and may be 5 megahertz (MHz) or the like.

The light receiving unit 5013 receives reflected light reflected from the object, calculates the distance information for each pixel according to a light reception result, generates a depth image in which the distance to the object is represented by a gradation value for each pixel, and outputs the depth image.

The above-described imaging device 1 is used for the light receiving unit 5013, and for example, the imaging device 1 serving as the light receiving unit 5013 calculates the distance information for each pixel from a signal intensity detected by each tap A/B, on the basis of the light emission control signal CLKp.

As described above, the imaging device 1 shown in FIG. 1 is able to be incorporated as the light receiving unit 5013 of the ranging module 5000 that obtains and outputs the information associated with the distance to the subject by the indirect ToF method. By adopting the imaging device 1 of one or more of the embodiments described above, it is possible to improve one or more distance measurement characteristics of the ranging module 5000 (e.g., distance accuracy, speed of measurement, and/or the like).

Figure 22:
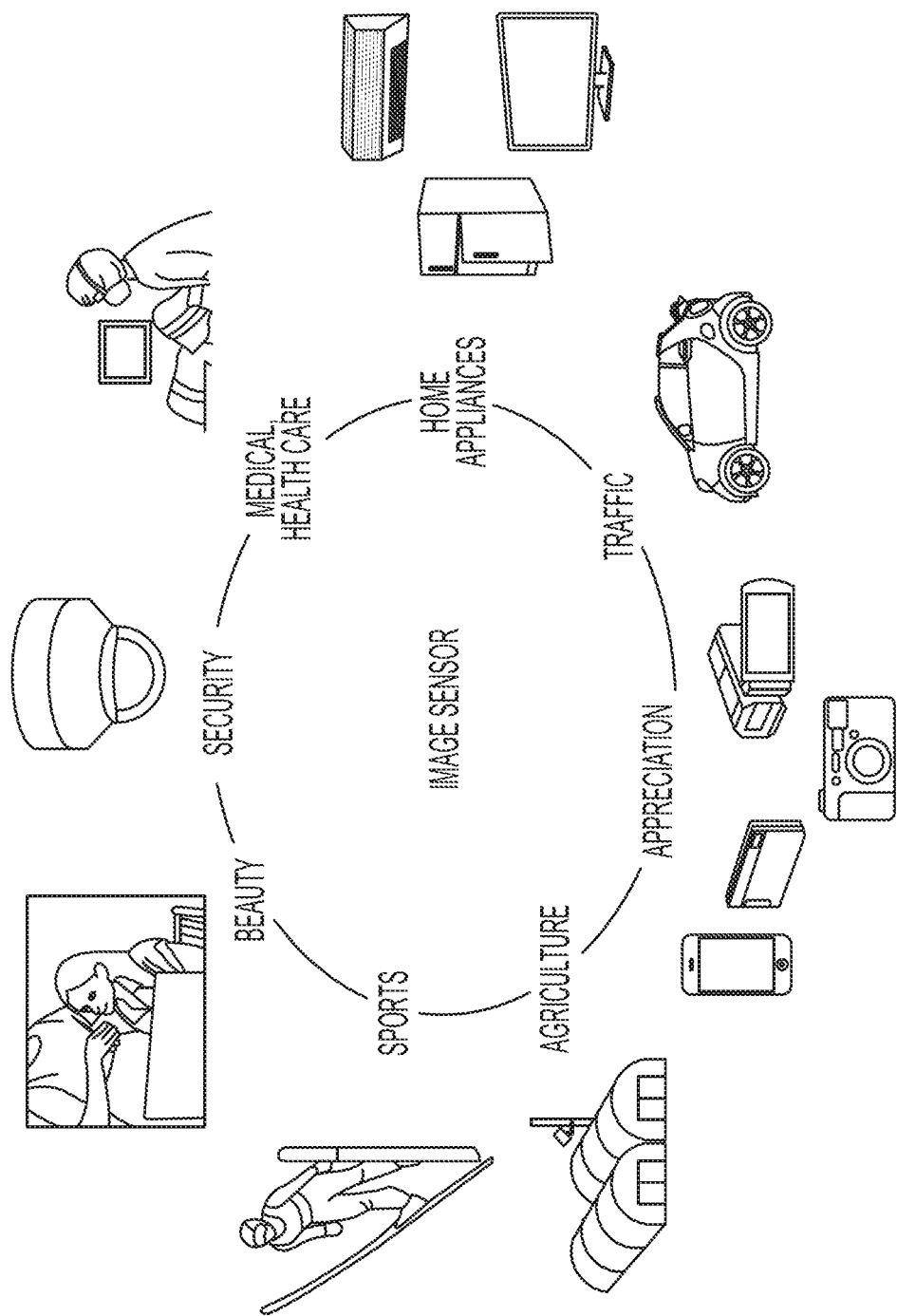
FIG. 22 is a diagram illustrating use examples of an imaging device according to at least one example embodiment.

FIG. 22 is a diagram illustrating use examples of an imaging device 1 according to at least one example embodiment.

For example, the above-described imaging device 1 (image sensor) can be used in various cases of sensing light such as visible light, infrared light, ultraviolet light, and X-rays as described below. The imaging device 1 may be included in apparatuses such as a digital still camera and a portable device with a camera function which capture images, apparatuses for traffic such as an in-vehicle sensor that captures images of a vehicle to enable automatic stopping, recognition of a driver state, measuring distance, and the like. The imaging device 1 may be included in apparatuses for home appliances such as a TV, a refrigerator, and an air-conditioner in order to photograph a gesture of a user and to perform an apparatus operation in accordance with the gesture. The imaging device 1 may be included in apparatuses for medical or health care such as an endoscope and an apparatus that performs angiography through reception of infrared light. The imaging device 1 may be included in apparatuses for security such as a security monitoring camera and a personal authentication camera. The imaging device 1 may be included in an apparatus for beauty such as a skin measuring device that photographs skin. The imaging device 1 may be included in apparatuses for sports such as an action camera, a wearable camera for sports, and the like. The imaging device 1 may be included in apparatuses for agriculture such as a camera for monitoring a state of a farm or crop.

With reference to FIGS. 1-22, it should be appreciated that at least one example embodiment is directed to an imaging device 1 a pixel array 300 including a plurality of pixels 51. Each pixel 51 may include a photoelectric conversion region PD that converts incident light into electric charge, and a charge transfer section 400/500/600/700 coupled to the photoelectric conversion region PD and having line symmetry along a first axis 405/505/605/705 in a plan view. Each charge transfer section may include a first transfer transistor TG0 coupled to a first floating diffusion FD0 and the photoelectric conversion region PD and located at a first side of the photoelectric conversion region PD. Each charge transfer section includes a second transfer transistor TG1 coupled to a second floating diffusion FD1 and the photoelectric conversion region PD and located at the first side of the photoelectric conversion region PD. Said another way, the transfer transistors TG0/TG1 are on a same half of the pixel 51. As shown, each charge transfer section includes a third transfer transistor OFG coupled to an overflow region and located at the first side of the photoelectric conversion region PD and between the first transfer transistor TG0 and the second transfer transistor TG1. As shown, the first axis 405/505/605/705 passes through a gate of the third transfer transistor OFG.

As shown in FIGS. 4-7, for example, the gate of the third transfer transistor OFG may be positioned further away from a center of the pixel 51 than a gate of the first transfer transistor and a gate of the second transfer transistor. In some examples, the gate of the first transfer transistor TG0 and the gate of the second transfer transistor TG1 are equidistant to the center of the pixel 51 (see FIGS. 4, 5, and 7, for example).

In some examples, the gate of the third transfer transistor OFG is closer to a center of the pixel 51 than the gate of the first transfer transistor TG0 and the gate of the second transfer transistor TG1 (see FIG. 18, for example).

In at least one example embodiment, each pixel 51 further comprises a transistor section TR in which a plurality of transistors are disposed, and the transistor section has line symmetry along the first axis. For example, the plurality of transistors include third and fourth transfer transistors FDG0/FDG1, and first and second reset transistors RST0/RST1 (see, e.g., FIGS. 16 and 17). In at least one example embodiment, the plurality of transistors include first and second selection transistors SEL0/SEL1, and first and second amplification transistors AMP0/AMP1 (see, e.g., FIG. 19).

According to at least one example embodiment, the photoelectric conversion region comprises a main portion and an extension portion that extends from the main portion. The first side of the photoelectric conversion region PD includes the extension portion (see FIGS. 5-7). In this case, the extension portion includes a first edge, a second edge, and a third edge connecting the first edge and the second edge. The first transfer transistor TG0 is located at the first edge, the second transfer transistor TG2 is located at the second edge, and the third transfer transistor OFG is located at the third edge.

According to at least one example embodiment, the third transistors OFG for at least some of the plurality of pixels 51 share drain regions (see, e.g., FIGS. 10, 12, 15, and 20). In the plan view, the charge transfer sections of neighboring pixels align with one another along a second axis that is perpendicular to the first axis (see, e.g., FIGS. 8-12, 14, and 16-20).

As shown in FIG. 3, an impurity concentration of a portion of the photoelectric conversion region PD that is closest to the first transfer transistor TG0 and the second transfer transistor TG1 is greater than an impurity concentration of a portion of the photoelectric conversion region PD that is furthest from the first transfer transistor and the second transfer transistor.

As shown in multiple figures, the first axis passes through a center of the pixel 51.

At least one example embodiment is directed to a system that includes the above described imaging device and a light source (e.g., within light emitting unit 5011).

In addition, it should be appreciated elements from different figures may be combined in any manner as understood by one of ordinary skill in the art.

Any processing devices, control units, processing units, etc. discussed above may correspond to one or many computer processing devices, such as a Field Programmable Gate Array (FPGA), an Application-Specific Integrated Circuit (ASIC), any other type of Integrated Circuit (IC) chip, a collection of IC chips, a microcontroller, a collection of microcontrollers, a microprocessor, Central Processing Unit (CPU), a digital signal processor (DSP) or plurality of microprocessors that are configured to execute the instructions sets stored in memory.

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, microcode, etc.) or combining software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising," "including," and "having" can be used interchangeably.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as an embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

Example embodiments may be configured as follows:

(1) An imaging device, comprising:
   a pixel array including a plurality of pixels, each pixel including:
      a photoelectric conversion region that converts incident light into electric charge; and
      a charge transfer section coupled to the photoelectric conversion region and having line symmetry along a first axis in a plan view, the charge transfer section including:
         a first transfer transistor coupled to a first floating diffusion and the photoelectric conversion region and located at a first side of the photoelectric conversion region; and
         a second transfer transistor coupled to a second floating diffusion and the photoelectric conversion region and located at the first side of the photoelectric conversion region.

(2) The imaging device of (1), wherein the charge transfer section includes a third transfer transistor coupled to an overflow region and located at the first side of the photoelectric conversion region and between the first transfer transistor and the second transfer transistor.

(3) The imaging device of one or more of (1) to (2), wherein the first axis passes through a gate of the third transfer transistor.

(4) The imaging device of one or more of (1) to (3), wherein the gate of the third transfer transistor is positioned further away from a center of the pixel than a gate of the first transfer transistor and a gate of the second transfer transistor.

(5) The imaging device of one or more of (1) to (4), wherein the gate of the first transfer transistor and the gate of the second transfer transistor are equidistant to the center of the pixel.

(6) The imaging device of one or more of (1) to (5), wherein the gate of the third transfer transistor is closer to a center of the pixel than the gate of the first transfer transistor and the gate of the second transfer transistor.

(7) The imaging device of one or more of (1) to (6), wherein each pixel further comprises a transistor section in which a plurality of transistors are disposed, and wherein the transistor section has line symmetry along the first axis.

(8) The imaging device of one or more of (1) to (7), wherein the plurality of transistors include third and fourth transfer transistors, and first and second reset transistors.

(9) The imaging device of one or more of (1) to (8), wherein the plurality of transistors include first and second selection transistors, and first and second amplification transistors.

(10) The imaging device of one or more of (1) to (9), wherein the photoelectric conversion region comprises a main portion and an extension portion that extends from the main portion, and wherein the first side of the photoelectric conversion region includes the extension portion.

(11) The imaging device of one or more of (1) to (10), wherein the extension portion includes a first edge, a second edge, and a third edge connecting the first edge and the second edge, wherein the first transfer transistor is located at the first edge, the second transfer transistor is located at the second edge, and the third transfer transistor is located at the third edge.

(12) The imaging device of one or more of (1) to (11), wherein the third transistors for at least some of the plurality of pixels share drain regions.

(13) The imaging device of one or more of (1) to (12), wherein, in the plan view, the charge transfer sections of neighboring pixels align with one another along a second axis that is perpendicular to the first axis.

(14) The imaging device of one or more of (1) to (13), wherein an impurity concentration of a portion of the photoelectric conversion region that is closest to the first transfer transistor and the second transfer transistor is greater than an impurity concentration of a portion of the photoelectric conversion region that is furthest from the first transfer transistor and the second transfer transistor.

(15) The imaging device of one or more of (1) to (14), wherein the first axis passes through a center of the pixel.

(16) A system, comprising:
  a light source; and
  an imaging device, including:
    a pixel array including a plurality of pixels, each pixel including:
      a photoelectric conversion region that converts incident light into electric charge; and
      a charge transfer section coupled to the photoelectric conversion region and having line symmetry along a first axis in a plan view, the charge transfer section including:
        a first transfer transistor coupled to a first floating diffusion and the photoelectric conversion region and located at a first side of the photoelectric conversion region; and
        a second transfer transistor coupled to a second floating diffusion and the photoelectric conversion region and located at the first side of the photoelectric conversion region.

(17) The system of (16), wherein the charge transfer section includes a third transfer transistor coupled to an overflow region and located at the first side of the photoelectric conversion region and between the first transfer transistor and the second transfer transistor.

(18) The system of one or more of (16) to (17), wherein the first axis passes through a gate of the third transfer transistor.

(19) The system of one or more of (16) to (18), wherein the gate of the third transfer transistor is positioned further away from a center of the pixel than a gate of the first transfer transistor and a gate of the second transfer transistor.

(20) A system, comprising:
  a light source;
  an imaging device, including:
    a pixel array including a plurality of pixels, each pixel including:
      a photoelectric conversion region that converts incident light into electric charge; and
      a charge transfer section coupled to the photoelectric conversion region and having line symmetry along a first axis in a plan view, the charge transfer section including:
        a first transfer transistor coupled to a first floating diffusion and the photoelectric conversion region and located at a first side of the photoelectric conversion region; and
        a second transfer transistor coupled to a second floating diffusion and the photoelectric conversion region and located at the first side of the photoelectric conversion region; and
  a signal processor configured to determine a distance to an object based on the electric charge.

Any one or more of the aspects/embodiments as substantially disclosed herein.

Any one or more of the aspects/embodiments as substantially disclosed herein optionally in combination with any one or more other aspects/embodiments as substantially disclosed herein.

One or more means adapted to perform any one or more of the above aspects/embodiments as substantially disclosed herein.

The invention claimed is:

1. An imaging device, comprising:
   a pixel array including a plurality of pixels, each pixel including:
     a photoelectric conversion region that converts incident light into electric charge; and
     a charge transfer section coupled to the photoelectric conversion region and having line symmetry along a first axis that passes through the charge transfer section in a plan view, the charge transfer section including:
       a first transfer transistor coupled to a first floating diffusion and the photoelectric conversion region and located within a first half of the pixel in the plan view;
       a second transfer transistor coupled to a second floating diffusion and the photoelectric conversion region and located within the first half of the pixel in the plan view; and
       a third transfer transistor coupled to the photoelectric conversion region and an overflow region and located within the first half of the pixel between the first transfer transistor and the second transfer transistor in the plan view.

2. The imaging device of claim 1, wherein the third transfer transistor transfers electric charge to the overflow region.

3. The imaging device of claim 1, wherein the first axis passes through a gate of the third transfer transistor.

4. The imaging device of claim 3, wherein the gate of the third transfer transistor is positioned further away from a center of the pixel than a gate of the first transfer transistor and a gate of the second transfer transistor.

5. The imaging device of claim 3, wherein the gate of the first transfer transistor and the gate of the second transfer transistor are equidistant to a center of the pixel.

6. The imaging device of claim 3, wherein the gate of the third transfer transistor is closer to a center of the pixel than the gate of the first transfer transistor and the gate of the second transfer transistor.

7. The imaging device of claim 1, wherein each pixel further comprises a transistor section in which a plurality of transistors are disposed, and wherein the transistor section has line symmetry along the first axis.

8. The imaging device of claim 7, wherein the plurality of transistors include third and fourth transfer transistors, and first and second reset transistors.

9. The imaging device of claim 8, wherein the plurality of transistors include first and second selection transistors, and first and second amplification transistors.

10. The imaging device of claim 2, wherein the photoelectric conversion region comprises a main portion and an extension portion that extends from the main portion, and wherein the extension portion is located within the first half of the pixel.

11. The imaging device of claim 10, wherein the extension portion includes a first edge, a second edge, and a third edge connecting the first edge and the second edge, wherein the first transfer transistor is located at the first edge, the second transfer transistor is located at the second edge, and the third transfer transistor is located at the third edge.

12. The imaging device of claim 10, wherein the third transfer transistors for at least some of the plurality of pixels share drain regions.

13. The imaging device of claim 10, wherein, in the plan view, the charge transfer sections of neighboring pixels align with one another along a second axis that is perpendicular to the first axis.

14. The imaging device of claim 1, wherein an impurity concentration of a portion of the photoelectric conversion region that is closest to the first transfer transistor and the second transfer transistor is greater than an impurity concentration of a portion of the photoelectric conversion region that is furthest from the first transfer transistor and the second transfer transistor.

15. The imaging device of claim 1, wherein the first axis passes through a center of the pixel.

16. A system, comprising:
a light source; and
an imaging device, including:
  a pixel array including a plurality of pixels, each pixel including:
    a photoelectric conversion region that converts incident light into electric charge; and
    a charge transfer section coupled to the photoelectric conversion region and having line symmetry along a first axis that passes through the charge transfer section in a plan view, the charge transfer section including:
      a first transfer transistor coupled to a first floating diffusion and the photoelectric conversion region and located within a first half of the pixel in the plan view;
      a second transfer transistor coupled to a second floating diffusion and the photoelectric conversion region and located within the first half of the pixel in the plan view; and
      a third transfer transistor coupled to the photoelectric conversion region and an overflow region and located within the first half of the pixel between the first transfer transistor and the second transfer transistor in the plan view.

17. The system of claim 16, wherein the third transfer transistor transfers electric charge to the overflow region.

18. The system of claim 16, wherein the first axis passes through a gate of the third transfer transistor.

19. The system of claim 18, wherein the gate of the third transfer transistor is positioned further away from a center of the pixel than a gate of the first transfer transistor and a gate of the second transfer transistor.

20. A system, comprising:
a light source;
an imaging device, including:
  a pixel array including a plurality of pixels, each pixel including:
    a photoelectric conversion region that converts incident light into electric charge; and
    a charge transfer section coupled to the photoelectric conversion region and having line symmetry along a first axis that passes through the charge transfer section in a plan view, the charge transfer section including:
      a first transfer transistor coupled to a first floating diffusion and the photoelectric conversion region and located within a first half of the pixel in the plan view;
      a second transfer transistor coupled to a second floating diffusion and the photoelectric conversion region and located within the first half of the pixel in the plan view; and
      a third transfer transistor coupled to the photoelectric conversion region and an overflow region and located within the first half of the pixel between the first transfer transistor and the second transfer transistor in the plan view; and
a signal processor configured to determine a distance to an object based on the electric charge.

* * * * *